United States Patent
Lee et al.

(10) Patent No.: US 12,175,099 B2
(45) Date of Patent: Dec. 24, 2024

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Kyungho Lee, Suwon-si (KR); Kiheung Kim, Suwon-si (KR); Taeyoung Oh, Suwon-si (KR); Jongcheol Kim, Suwon-si (KR); Hyongryol Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/302,276

(22) Filed: Apr. 18, 2023

(65) Prior Publication Data
US 2024/0028221 A1   Jan. 25, 2024

(30) Foreign Application Priority Data

Jul. 25, 2022 (KR) .................. 10-2022-0091696
Oct. 13, 2022 (KR) .................. 10-2022-0131154

(51) Int. Cl.
  *G06F 3/06* (2006.01)

(52) U.S. Cl.
  CPC .......... *G06F 3/0623* (2013.01); *G06F 3/0653* (2013.01); *G06F 3/0673* (2013.01)

(58) Field of Classification Search
  CPC ..... G06F 3/0623; G06F 3/0653; G06F 3/0673
  See application file for complete search history.

(56) References Cited

U.S. PATENT DOCUMENTS

| | | |
|---|---|---|
| 9,589,606 B2 | 3/2017 | Lin et al. |
| 9,865,326 B2 | 1/2018 | Bains et al. |
| 9,874,931 B1 | 1/2018 | Koenck et al. |
| 10,019,350 B1 | 7/2018 | Lee et al. |
| 10,083,737 B2 | 9/2018 | Bains et al. |
| 10,210,925 B2 | 2/2019 | Bains et al. |

(Continued)

FOREIGN PATENT DOCUMENTS

| | | |
|---|---|---|
| CN | 115985379 A | 4/2023 |
| JP | 6463141 B2 | 1/2019 |

(Continued)

OTHER PUBLICATIONS

Extended European Search Report corresponding to European Patent Application No. 23186811.8 (10 pages) (dated Jan. 2, 2024).

*Primary Examiner* — Jae U Yu
(74) *Attorney, Agent, or Firm* — Myers Bigel, P.A.

(57) ABSTRACT

A semiconductor memory device includes a memory cell array including a plurality of memory cell rows and a row hammer management circuit. The row hammer management circuit stores counted values in count cells of each of the plurality of memory cell rows as count data, and performs an internal read-update-write operation to read the count data from the count cells of a target memory cell row from among the plurality of memory cell rows, to update the count data that was read to obtain updated count data, and to write the updated count data in the count cells of the target memory cell row. The row hammer management circuit includes a hammer address queue. The row hammer management circuit changes the updated count data randomly, based on an event signal indicating a state change of the hammer address queue.

20 Claims, 39 Drawing Sheets

(56) References Cited

U.S. PATENT DOCUMENTS

| | | |
|---|---|---|
| 10,825,534 B2 | 11/2020 | Nale |
| 2014/0156923 A1* | 6/2014 | Bains ................ G11C 11/40611 |
| | | 711/106 |
| 2022/0121398 A1 | 4/2022 | Nale et al. |
| 2022/0122652 A1 | 4/2022 | Brandl et al. |
| 2022/0165347 A1 | 5/2022 | Pan |
| 2022/0188024 A1 | 6/2022 | Brandl |
| 2022/0189537 A1 | 6/2022 | Kim |
| 2022/0293160 A1 | 9/2022 | Cao |
| 2023/0021622 A1 | 1/2023 | Cho et al. |
| 2023/0044186 A1 | 2/2023 | You et al. |

FOREIGN PATENT DOCUMENTS

| | | |
|---|---|---|
| KR | 20220082704 A | 6/2022 |
| KR | 20230014032 A | 1/2023 |
| KR | 20230021496 A | 2/2023 |

\* cited by examiner

FIG. 20

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BLT | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | H | BLT | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 21

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| WRA | L | H | L | H | H | L | BLT | BA0 | BA1 | BG0 | BG1 | BG2 | CID0 | CID1 | CID2 |
|  | H | V | C3 | C4 | C5 | C6 | C7 | C8 | C9 | C10 | V | AP | L | V | CID3 |
| RDA | L | H | L | H | H | H | BLT | BA0 | BA1 | BG0 | BG1 | BG2 | CID0 | CID1 | CID2 |
|  | H | C2 | C3 | C4 | C5 | C6 | C7 | C8 | C9 | C10 | V | AP | V | V | CID3 |

FIG. 22

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | H | CID3 | BA0 | BA1 | BG0 | BG1 | BG2 | CID0 | CID1 | CID2 |

SEMICONDUCTOR MEMORY DEVICE AND MEMORY SYSTEM INCLUDING THE SAME

CROSS-REFERENCE TO RELATED APPLICATIONS

This application claims the benefit of priority under 35 U.S.C. § 119 to Korean Patent Application No. 10-2022-0091696, filed on Jul. 25, 2022 and to Korean Patent Application No. 10-2022-0131154, filed on Oct. 13, 2022, in the Korean Intellectual Property Office, the disclosures of which are incorporated by references herein in their entirety.

BACKGROUND

The present disclosure relates to memories, and more particularly to semiconductor memory devices to defend a row hammer attack and memory systems including the same.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Example embodiments may provide a semiconductor memory device capable of defending a row hammer attack.

Example embodiments may provide a memory system capable of defending a row hammer attack.

According to example embodiments, a semiconductor memory device includes a memory cell array and a row hammer management circuit. The memory cell array includes a plurality of memory cell rows, each including a respective plurality of memory cells. The row hammer management circuit is configured to perform operations including determining count data by counting a number of times each of the plurality of memory cell rows are accessed in response to an active command from an external memory controller, storing the counted values in count cells associated with respective ones of the plurality of memory cell rows, and in response to a first command applied after the active command was applied, performing an internal read-update-write operation to read the count data from the count cells of a target memory cell row from among the plurality of memory cell rows, updating the count data that was read to obtain updated count data, and writing the updated count data in a respective one of the count cells of the target memory cell row. The row hammer management circuit includes a hammer address queue. The hammer address queue is configured to perform operations including storing one or more candidate hammer addresses of the plurality of memory cell rows which are intensively accessed, based on a comparison of respective ones of the counted values associated with a respective one of the plurality of memory cell rows with a first reference number of times of access, and providing one of the candidate hammer addresses stored in the hammer address queue as a hammer address. The row hammer management circuit may change the updated count data randomly, based on an event signal indicating a state change of the hammer address queue.

According to example embodiments, a semiconductor memory device includes a memory cell array, a row hammer management circuit and a refresh control circuit. The memory cell array includes a plurality of memory cell rows, each including a respective plurality of memory cells. The row hammer management circuit perform operations including determining count data by counting a number of times each of the plurality of memory cell rows are accessed in response to an active command from an external memory controller, storing the count data as counted values in count cells associated with respective ones of the plurality of memory cell rows, and in response to a first command applied after the active command was applied, performing an internal read-update-write operation to read the count data from the count cells of a target memory cell row from among the plurality of memory cell rows, updating the count data that was read to obtain updated count data, and writing the updated count data in a respective one of the count cells of the target memory cell row. The row hammer management circuit includes a hammer address queue. The hammer address queue perform operations including storing one or more candidate hammer addresses of the plurality of memory cell rows which are intensively accessed up to a maximum number of candidate hammer addresses in the hammer address queue, based on a comparison of respective ones of the counted values associated with a respective one of the plurality of memory cell rows with a first reference number of times of access and providing one of the candidate hammer addresses stored in the hammer address queue as a hammer address. The row hammer management circuit is configured to change the updated count data randomly during a first time interval, based on a random enable signal. The refresh control circuit receives the hammer address and performs a hammer refresh operation on one or more victim memory cell rows which are physically adjacent to a memory cell row corresponding to the hammer address.

According to example embodiments, a memory system includes a semiconductor memory device and a memory controller to control the semiconductor memory device. The semiconductor memory device includes a memory cell array, a row hammer management circuit and a refresh control circuit. The memory cell array includes a plurality of memory cell rows, each including a plurality of memory cells. The row hammer management circuit perform operations including determining count data by counting a number of times each of the plurality of memory cell rows are accessed in response to an active command from an external memory controller to store counted values in count cells of each of the plurality of memory cell rows as count data, and in response to a first command applied after the active command was applied, performing an internal read-update-write operation to read the count data from the count cells of a target memory cell row from among the plurality of memory cell rows, updating the count data that was read to obtain updated count data, and writing the updated count data in a respective one of the count cells of the target memory cell row. The row hammer management circuit includes a hammer address queue. The hammer address queue is configured to perform operations including storing one or more candidate hammer addresses of the plurality of memory cell rows which are intensively accessed up to a maximum number of candidate hammer addresses in the hammer address queue, based on a comparison of respective ones of the counted values associated with a respective one of the plurality of memory cell rows with a first reference number of times of access, and providing one of the candidate hammer addresses stored in the hammer address queue as a hammer address. The row hammer management circuit is configured to change the updated count data randomly, based on an event signal indicating a state change of the hammer address queue. The refresh control circuit receives the hammer address and performs a hammer refresh operation on one or more victim memory cell rows which are physically adjacent to a memory cell row corresponding to the hammer address.

Accordingly, in the semiconductor memory device according to example embodiments while the row hammer management circuit counts each of active numbers associated with the plurality of memory cell rows to store the counted values in the count cells of each of the plurality of memory cell rows as count data, the row hammer management circuit randomizes count data in the count cells of each of the plurality of memory cell rows in response to an event of the hammer address queue, or periodically and thus prevent overflow of the hammer address queue and performance of the memory system from being degraded due to intentional accesses of a hacker.

BRIEF DESCRIPTION OF THE DRAWINGS

Example embodiments of the present disclosure will be described below in more detail with reference to the accompanying drawings.

FIGS. 20 through 22 illustrate example commands which may be used in the memory system of FIG. 1.

DETAILED DESCRIPTION

Various example embodiments of the present disclosure will be described more fully hereinafter with reference to the accompanying drawings, in which example embodiments are shown.

Figure 1:
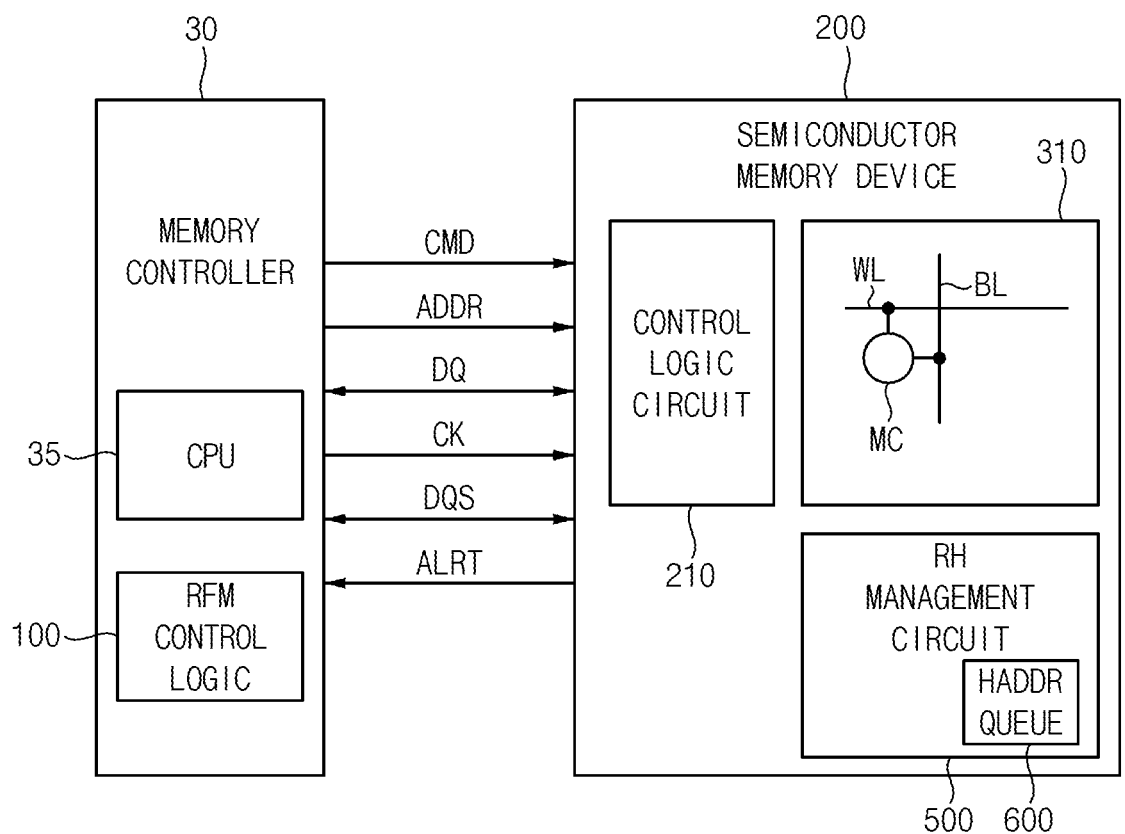
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to a request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM or the like.

The memory controller 30 may transmit a clock signal CK (the clock signal CK may be referred to a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR respectively may be used interchangeably. The memory controller 30 may transmit a data strobe signal DQS to the semiconductor memory device 200 when the memory controller 30 writes data signal DQ in the semiconductor memory device 200. The semiconductor memory device 200 may transmit a data strobe signal DQS to the memory controller 30 when the memory controller 30 reads data signal DQ from the semiconductor memory device 200. The address ADDR may be accompanied by the command CMD and the address ADDR may be referred to as an access address.

The memory controller 30 may include a central processing unit (CPU) 35 that controls overall operation of the memory controller 30 and a refresh management (RFM) control logic 100 that generates a refresh management command associated with a row hammer of the plurality of memory cell rows of the semiconductor memory device 200.

The semiconductor memory device 200 may include a memory cell array 310 that stores the data signal DQ, a control logic circuit 210 and a row hammer (RH) management circuit 500.

The control logic circuit 210 may control operations of the semiconductor memory device 200. The memory cell array 310 may include a plurality of memory cell rows and each of the memory cell rows may include a plurality of (volatile) memory cells. The memory cell MC may be connected to a word-line WL and a bit-line BL.

The row hammer management circuit 500, in response to an active command from the memory controller 30, may count the number of times of access associated with each of the plurality of memory cell rows to store the counted values in count cells of each of the plurality of memory cell rows as count data. The row hammer management circuit 500 may include a hammer address (HADDR) queue 600. The hammer address queue 600 may store one or more candidate hammer addresses up to a first number based on first-in first-out (FIFO), which are intensively accessed, from among the plurality of memory cell rows, based on a comparison of the counted value with a first reference number of times, may transition a logic level of an alert signal ALRT provided to the memory controller 30 in response to a number of the candidate hammer addresses stored therein reaching the first number, and may output one of the candidate hammer addresses stored therein as a hammer address, in response to the number of the candidate hammer addresses stored therein reaching the first number. Herein, the terms "intensively accessed" may mean that a particular memory cell row is accessed equal to or more than the first reference number of times.

In response to a first command such as a precharge command applied after the active command, the row hammer management circuit 500 may perform an internal read-update-write operation, to read the count data from a target memory cell row from among the plurality of memory cell rows, to update the read count data, and to write the updated count data in the target memory cell row.

The row hammer management circuit 500 may perform the internal read-update-write operation based on a flag of a precharge command which is applied after the active command is applied and the control logic circuit 210 may precharge the target memory cell row.

In example embodiments, the row hammer management circuit 500 may change the updated count data randomly based on an event signal indicating a state change of the hammer address queue 600 to generate randomized count data and may store the randomized count data in the count cells.

The control logic circuit 210 may control access on the memory cell array 310 and may control the row hammer management circuit 500.

The semiconductor memory device 200 performs a refresh operation periodically due to charge leakage of memory cells storing data. Due to scale down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller. The memory controller is responsible for the hammer refresh operation in the TRR scheme and the semiconductor memory device is responsible for the hammer refresh operation in the in-memory refresh scheme.

The chip size overhead for the in-memory refresh may be significant as the memory capacity is increased and demands on low power consumption of the semiconductor memory device is increased. In addition, the power consumption may be increased because the semiconductor memory device has to consider the occurrence of the hammer refresh operation even though there is no intensive access. In addition, a row hammer of some of memory cell row selected from the plurality of the memory cell rows is managed.

In the memory system 20 according to example embodiments, while the row hammer management circuit 500 counts each of active numbers associated with the plurality of memory cell rows to store the counted values in the count cells of each of the plurality of memory cell rows as count data and may manage the row hammer of all of the memory cell rows based on the counted values, the semiconductor memory device 200 randomizes count data in the count cells of each of the plurality of memory cell rows in response to an event of the hammer address queue 600, or periodically and thus prevent overflow of the hammer address queue 600 and performance of the memory system from being degraded due to intentional accesses of a hacker.

Figure 2:
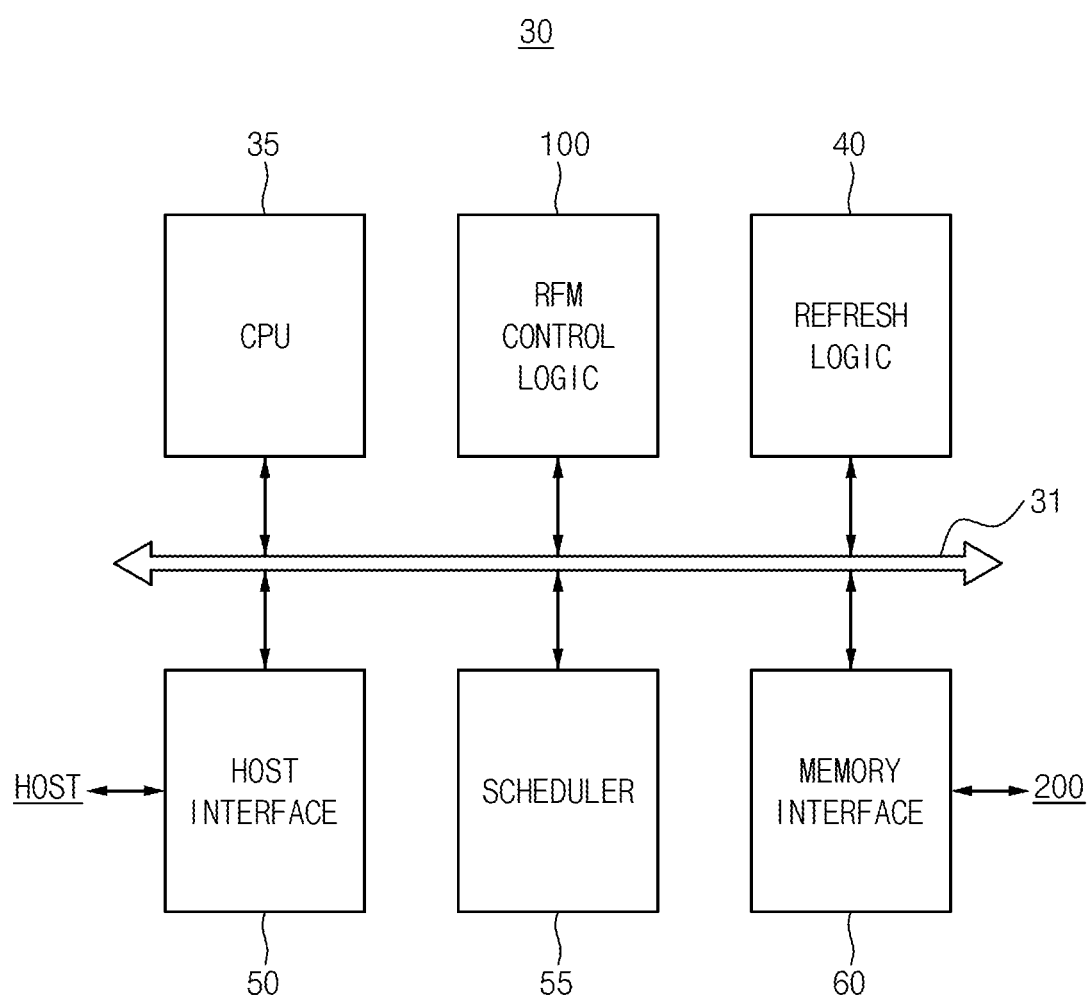
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include the CPU 35, the RFM control logic 100, a refresh logic 40, a host interface 50, a scheduler 55 and a memory interface 60 which are connected to each other through a bus 31.

The CPU 35 may control overall operation of the memory controller 30. The CPU 35 may control the RFM control logic 100, the refresh logic 40, the host interface 50, the scheduler 55 and the memory interface 60 through the bus 31.

The refresh logic 40 may generate an auto refresh command for refreshing memory cells of the plurality of memory cell rows based on a refresh interval of the semiconductor memory device 200.

The host interface 50 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the active command and the precharge command to the semiconductor memory device 200 via the memory interface 60 and the semiconductor memory device 200 may update an active count of each of the memory cell rows to may manage the row hammer of all of the memory cell rows.

The RFM control logic 100 may apply a refresh management command to the semiconductor memory device 200 through the memory interface 60 in response to a transition of the alert signal ALRT from the semiconductor memory device 200 such that the semiconductor memory device 200 performs a hammer refresh operation on one or more victim memory cell rows which are physically adjacent to a memory cell row corresponding to the hammer address.

Figure 3:
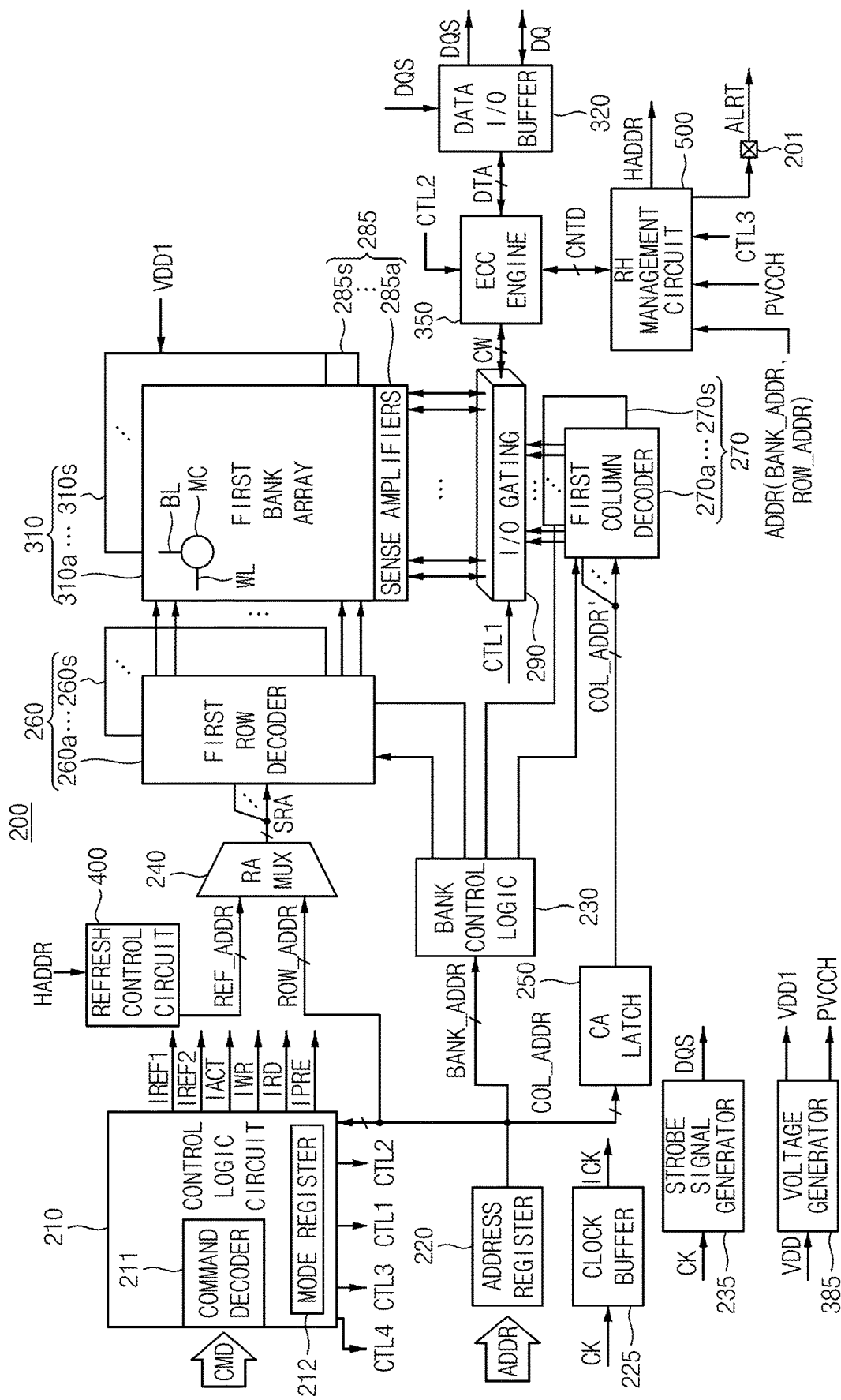
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 350, a clock buffer 225, a strobe signal generator 235, a voltage generator 385, the row hammer management circuit 500 and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at respective intersections of a plurality of word-lines WL and a plurality of bit-lines BL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250. In addition, the address register 220 may provide the received bank address BANK_ADDR and the received row address ROW_ADDR to the row hammer management circuit 500.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may output one or more hammer refresh addresses designating one or more victim memory cell rows physically adjacent to a memory cell row corresponding to the hammer address as the refresh row address REF_ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

Codeword CW (e.g., read codeword RCW in FIG. 20) read from a selected one bank array of the first through sixteenth bank arrays 310a~310s is sensed by a sense amplifier coupled to the selected one bank array from which the data is to be read, and is stored in the read data latches. The codeword CW stored in the read data latches may be provided to the data I/O buffer 320 as data DTA (e.g., corrected data C_DTA in FIG. 20) after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210. The ECC engine 350 may perform an ECC encoding and an ECC decoding on count data CNTD provided from the row hammer management circuit 500 based on the second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the data I/O buffer 320.

The voltage generator 385 may generate an operating voltage VDD1 based on a power supply voltage VDD received from an outside device, may generate a power stabilizing signal PVCCH indicating that the power supply voltage VDD has reached a reference voltage level, may provide the operating voltage VDD1 to the memory cell array 310, and may provide the power stabilizing signal PVCCH to the row hammer management circuit 500.

The row hammer management circuit 500 may count the number of times of access associated with each of the plurality of memory cell rows in response to an active command from the memory controller 30 to store the counted values in count cells of each of the plurality of memory cell rows as the count data CNTD. The row hammer management circuit 500 may store one or more candidate hammer addresses up to a first number based on first-in first-out (FIFO) scheme, which are intensively accessed, from among the plurality of memory cell rows, based on a comparison of the counted value with a reference number of times, may transition a logic level of the alert signal ALRT provided to the memory controller through an alert pin 201 in response to a number of the candidate hammer addresses stored therein reaching the first number, and may provide one of the candidate hammer addresses stored therein as a hammer address HADDR to the refresh control circuit 400.

The row hammer management circuit 500 may change the updated count data randomly based on an event signal indicating a state change of the hammer address queue 600 to generate randomized count data and may store the randomized count data in the count cells.

The control logic circuit 210 may control operations of the semiconductor memory device 200. For example, the control logic circuit 210 may generate control signals for the semiconductor memory device 200 in order to perform a write operation, a read operation, a normal refresh operation and a hammer refresh operation. The control logic circuit 210 may include a command decoder 211 that decodes the command CMD received from the memory controller 30 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit, the second control signal CTL2 to the ECC engine 350, and a third control signal CTL3 to the row hammer management circuit 500. In addition, the command decoder 211 may generate internal command signals including the first refresh control signal IREF1, the second refresh control signal IREF2, an active signal IACT, a precharge signal IPRE, a read signal IRD and a write signal IWR by decoding the command CMD.

Figure 4:
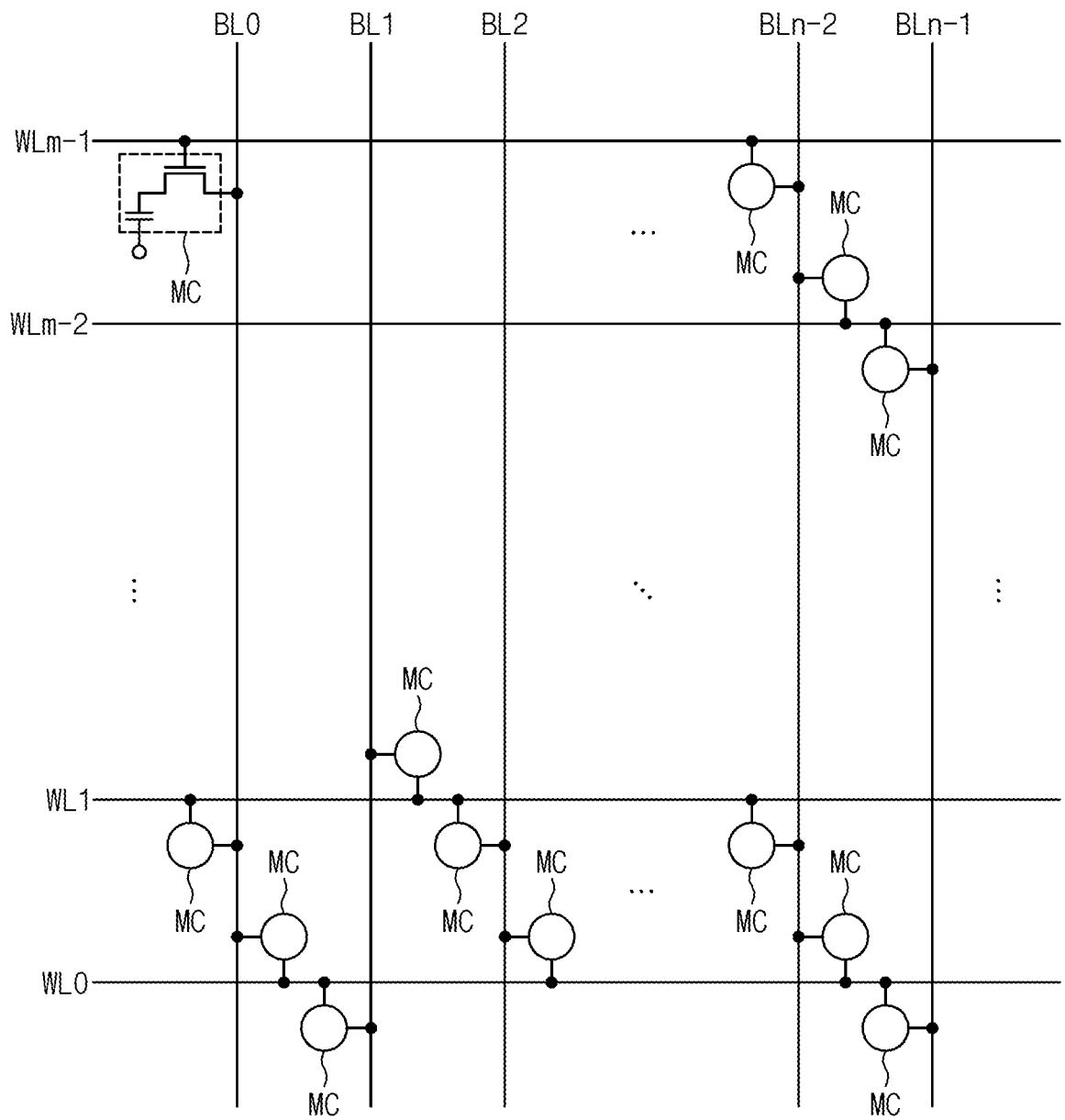
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a plurality of word-lines WL0~WLm-1 (m is a natural number greater than two), a plurality of bit-lines BL0~BLn-1 (n is a natural number greater than two), and a plurality of memory cells MCs disposed at intersections between the word-lines WL0~WLm-1 and the bit-lines BL0~BLn-1. Each of the memory cells MCs includes a cell transistor coupled to each of the word-lines WL0~WLm-1 and each of the bit-lines BL0~BLn-1 and a cell capacitor coupled to the cell transistor. Each of the memory cells MCs may have a DRAM cell structure. Each of the word-lines WL0~WLm-1 extends in a first direction D1 and each of the bit-lines BL1~BLn-1 extends in a second direction D2 crossing the first direction D1.

The word-lines WL0~WLm-1 coupled to the plurality of memory cells MCs may be referred to as rows of the first bank array 310a and the bit-lines BL0~BLn-1 coupled to the plurality of memory cells MCs may be referred to as columns of the first bank array 310a.

Figure 5:
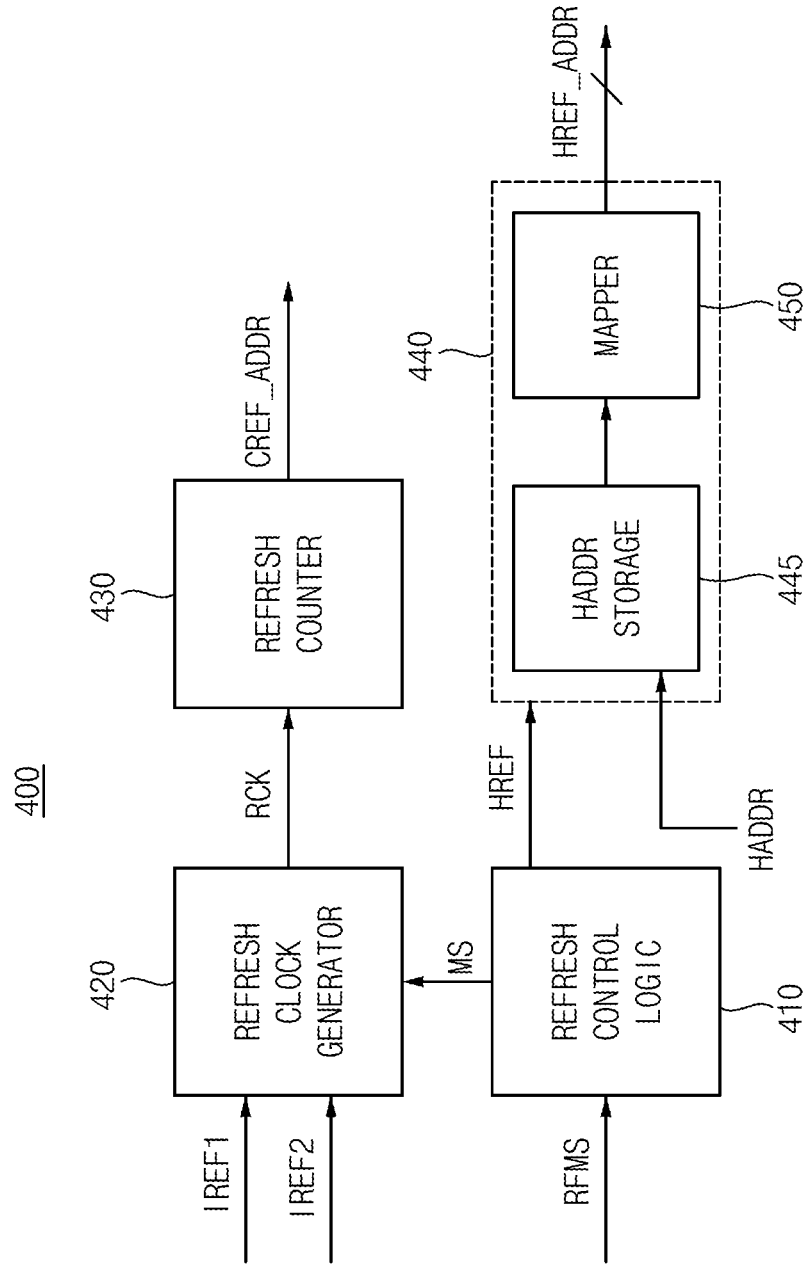
FIG. 5 is a block diagram illustrating an example of the refresh control circuit in FIG. 3 according to example embodiments.

FIG. 5 is a block diagram illustrating an example of the refresh control circuit in FIG. 3 according to example embodiments.

Referring to FIG. 5, the refresh control circuit 400 may include a refresh control logic 410, a refresh clock generator 420, a refresh counter 430 and a hammer refresh address generator 440.

The refresh control logic 410 may provide a mode signal MS in response to a refresh management signal RFMS. In addition, the refresh control logic 410 may provide the hammer refresh address generator 440 with a hammer refresh signal HREF to control output timing of the hammer address in response to one of the first refresh control signal IREF1 and the second refresh control signal IREF2.

The control logic circuit 210 in FIG. 3 may provide the refresh control circuit 400 with the refresh management signal RFMS based on a refresh management command from the memory controller 30.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to the receiving the first refresh control signal IREF1 or when the second refresh control signal IREF2 is activated.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 445 and a mapper 450.

The hammer address storage 445 may store the hammer address HADDR and may output the hammer address HADDR to the mapper 450 in response to the hammer refresh signal HREF. The mapper 450 may generate hammer refresh addresses HREF_ADDR designating one or more victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3.

Figure 6:
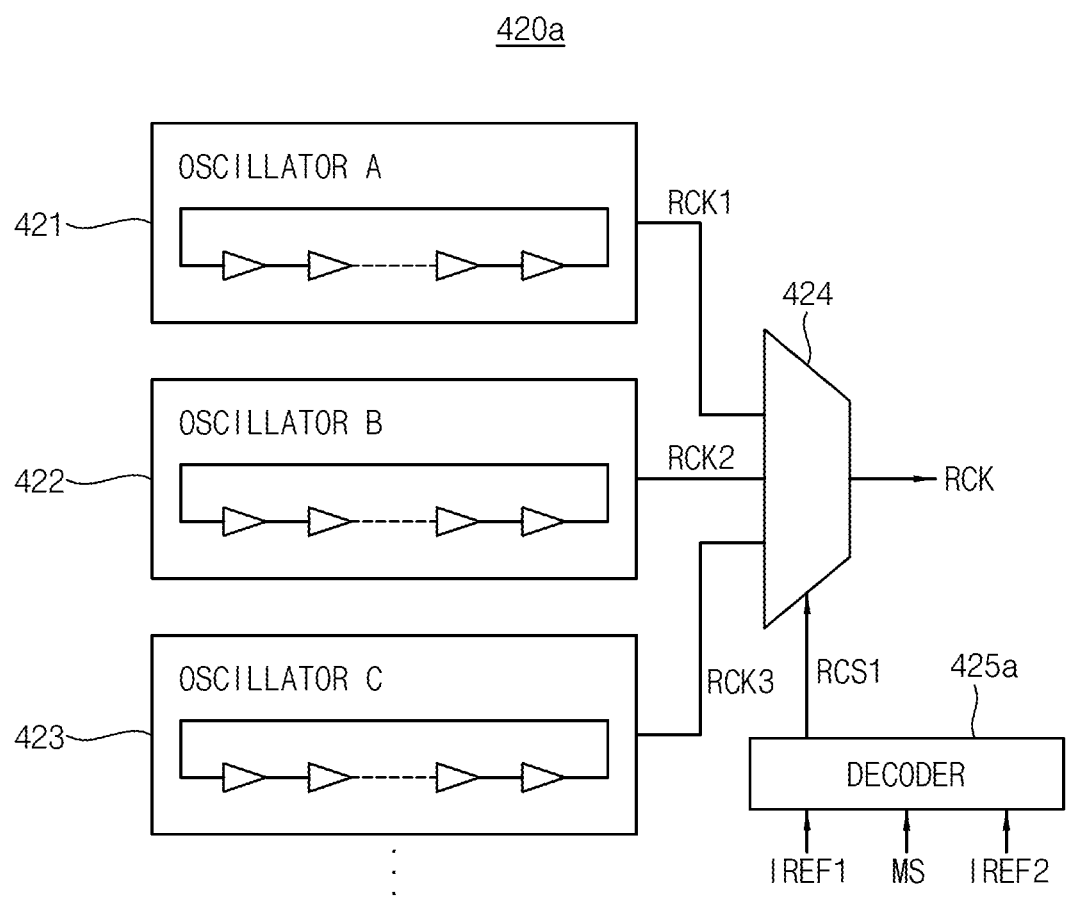
FIG. 6 is a circuit diagram illustrating an example of the refresh clock generator shown in FIG. 5 according to example embodiments.

FIG. 6 is a circuit diagram illustrating an example of the refresh clock generator shown in FIG. 5 according to example embodiments.

Referring to FIG. 6, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The refresh clock signals RCK1, RCK2 and RCK3 having different periods may be generated based on different delays within the respective oscillators 421, 422, and 423. The multiplexer 424 selects one of the refresh clock signals RCK1, RCK2 and RCK3 to provide the refresh clock signal RCK in response to the clock control signal RCS1.

Because the mode signal MS indicates that the row hammer event occurs, the refresh clock generator 420a may adjust a refresh cycle by selecting one of the refresh clock signals RCK1, RCK2 and RCK3.

Figure 7:
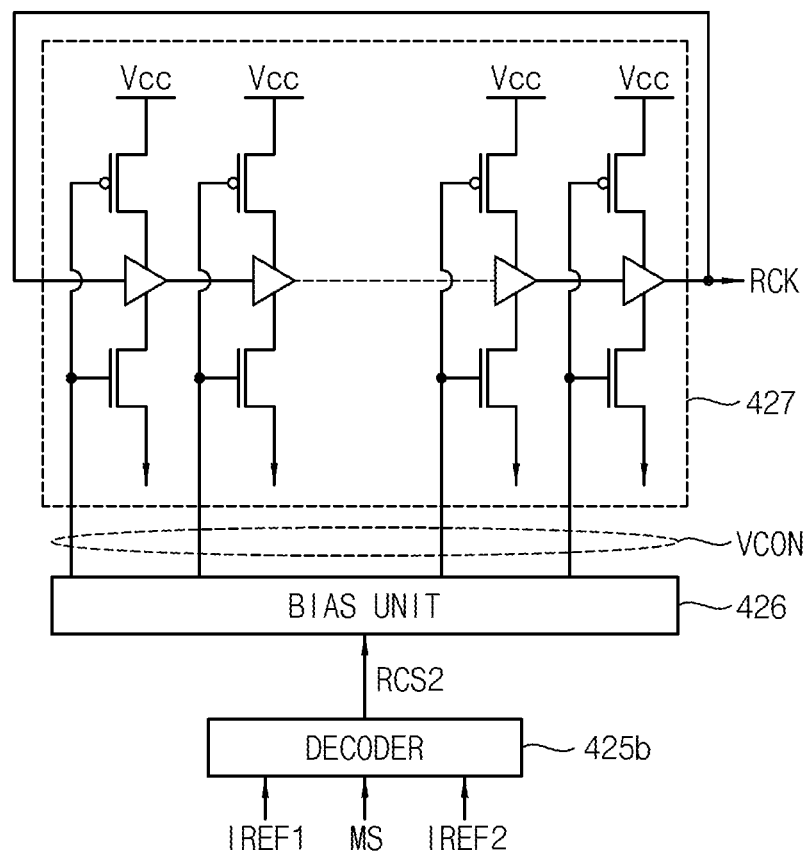
FIG. 7 is a circuit diagram illustrating another example of the refresh clock generator in FIG. 5 according to example embodiments.

FIG. 7 is a circuit diagram illustrating another example of the refresh clock generator in FIG. 5 according to example embodiments.

Referring to FIG. 7, a refresh clock generator 420b may include a decoder 425b, a bias unit 426 and an oscillator 427. The oscillator 427 may include a plurality of delay cells connected in series. Each of the plurality of delay cells may be connected between a power supply voltage Vcc and a ground voltage and each of the plurality of delay cells may include a p-channel metal-oxide semiconductor (PMOS) transistor, a buffer and an n-channel metal-oxide semiconductor (NMOS) transistor connected in series between the power supply voltage Vcc and the ground voltage.

The decoder 425b may decode the first refresh control signal IREF1, the second refresh control signal IREF2 and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON applied to gates of the PMOS transistors and the NMOS transistors.

Because the mode signal MS indicates that the refresh management signal RFMS has received (that is, the row hammer event occurs), the refresh clock generator 420b may adjust a refresh cycle by varying a period of the refresh clock signal RCK based on the clock control signal RCS2.

Figure 8:
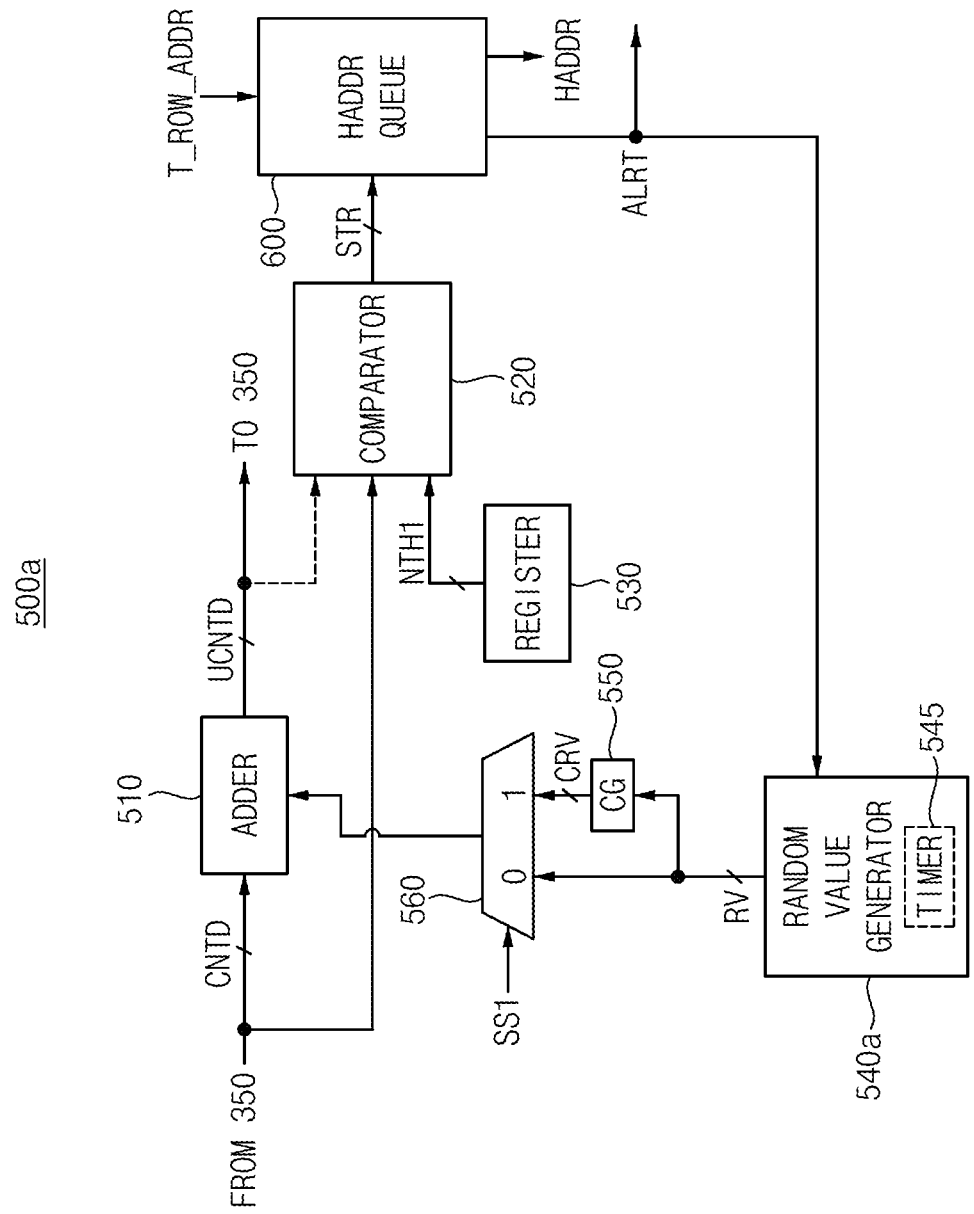
FIG. 8 is a block diagram illustrating an example of the row hammer management circuit in the semiconductor memory device of FIG. 3 according to example embodiments.

FIG. 8 is a block diagram illustrating an example of the row hammer management circuit in the semiconductor memory device of FIG. 3 according to example embodiments.

Referring to FIG. 8, a row hammer management circuit 500a may include an adder 510, a comparator 520, a register 530, a random value generator 540a, a complementary value (CG) generator 550, a multiplexer 560 and the hammer address queue 600.

The adder 510 may update the count data CNTD read from the count cells of the target memory cell row to provide an updated count data UCNTD by increasing the count data CNTD by one. The count data CNTD is read from the count cells of the target memory cell row. An ECC decoding operation is performed on the count data CNTD. The adder 510 may update the read count data CNTD. The adder 510 may be implemented with an up-counter.

The updated count data UCNTD is provided to the ECC engine 350 and the ECC engine 350 performs an ECC encoding operation on the updated count data UCNTD.

The register 530 may store a first reference number of times NTH1. The comparator 520 may compare the read count data CNTD with the first reference number of times NTH1 to output a store signal STR indicating a result of the comparison. The comparator 520 may activate the store signal STR in response to the read count data CNTD being equal to or greater than the first reference number of times NTH1.

The first reference number of times NTH1 may include default reference number of times and multiples of the default reference number of times and thus, the store signal STR may include a plurality of bits.

The hammer address queue 600, in response to the store signal STR indicating that the read count data CNTD or the updated count data UCNTD is equal to greater than the first reference number of times NTH1, may store a target access address T_ROW_ADDR designating the target memory cell row as a candidate hammer address and may provide the refresh control circuit 400 in FIG. 3 with one of candidate hammer addresses stored therein as the hammer address HADDR. The hammer address queue 600, may store the target access addresses T_ROW_ADDR whose number of times of access is equal to greater than the first reference number of times NTH1 as the candidate hammer addresses and may indicate a state of the hammer address queue 600 as a logic level of the alert signal ALRT based on a number of the candidate hammer addresses stored therein. The alert signal ALRT may correspond to an event signal.

The random value generator 540*a* may generate a random value RV in response to the alert signal ALRT being activated. The complementary value generator 550 may generate a complementary value CRV of the random value RV by inverting the random value RV. The complementary value CRV may correspond to two's complement of the random value RV. The multiplexer 560 may provide the adder 510 with one of the random value RV and the complementary value CRV in response to a selection signal S Sl.

Therefore, the adder 510 may change the updated count data UCNTD randomly by adding one of the random value RV and/or the complementary value CRV to a value in which the read count data CNTD is increased by one during the alert signal ALRT is activated. That is, the adder 510 may change the updated count data UCNTD randomly by adding the random value RV to a value in which the read count data CNTD is increased by one or subtracting the random value RV from a value in which the read count data CNTD is increased by one when the alert signal ALRT is activated.

The random value generator 540*a* may include a timer 545 that is enabled during a first time interval in response to the alert signal ALRT being activated. The random value generator 540*a* may generate the random value RV during the first time interval after the alert signal ALRT is activated, and the adder 510 may change the updated count data UCNTD randomly by adding the random value RV to a value in which the read count data CNTD is increased by one or subtracting the random value RV from a value in which the read count data CNTD is increased by one after the alert signal ALRT is activated.

Figure 9:
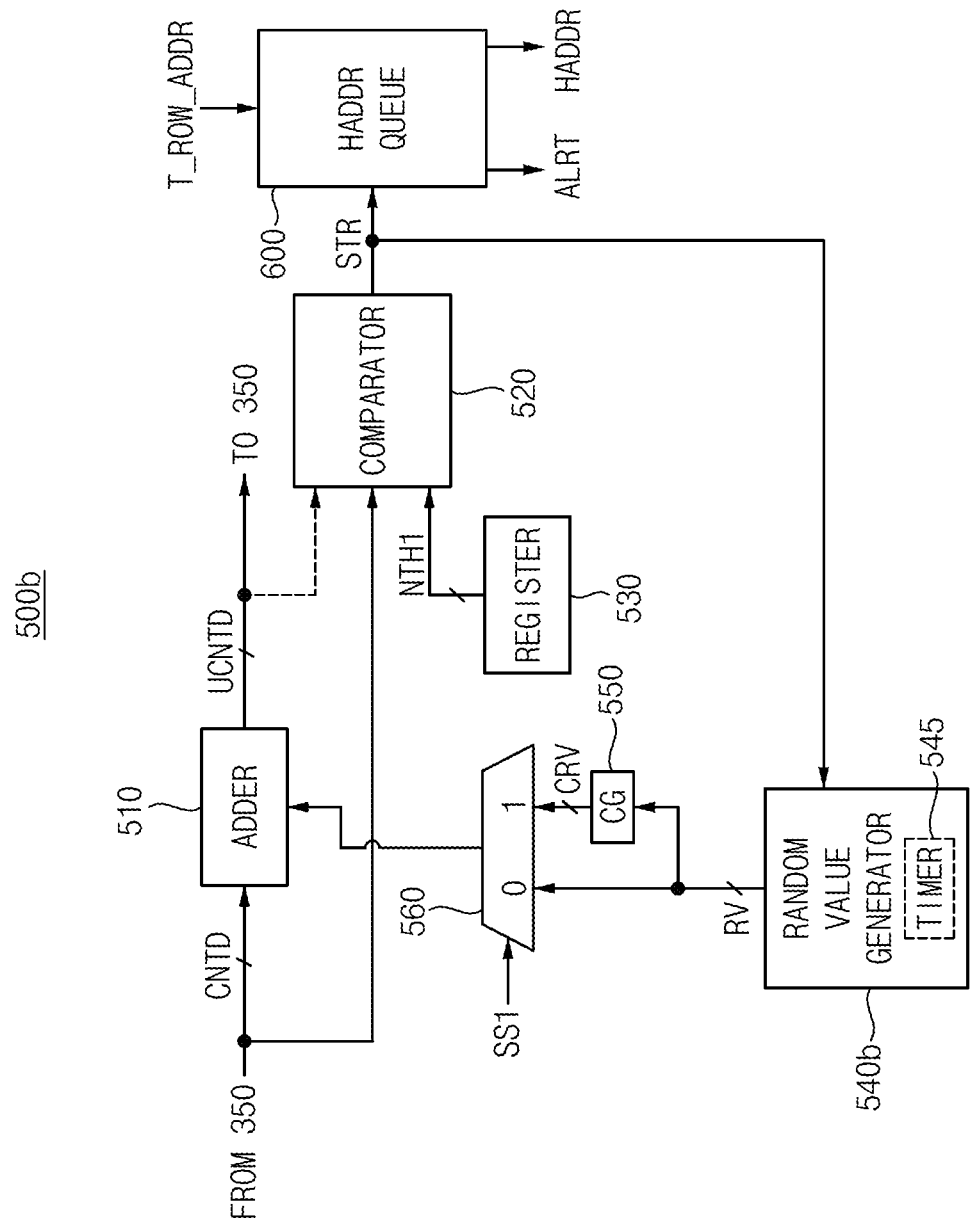
FIG. 9 is a block diagram illustrating an example of the row hammer management circuit in the semiconductor memory device of FIG. 3 according to example embodiments.

FIG. 9 is a block diagram illustrating an example of the row hammer management circuit in the semiconductor memory device of FIG. 3 according to example embodiments.

Referring to FIG. 9, a row hammer management circuit 500*b* may include an adder 510, a comparator 520, a register 530, a random value generator 540*b*, a complementary value generator 550, a multiplexer 560 and the hammer address queue 600.

In FIG. 9, descriptions repeated with FIG. 8 will be omitted.

The random value generator 540*b* may generate a random value RV in response to the store signal STR being activated. The complementary value generator 550 may generate a complementary value CRV of the random value RV by inverting the random value RV. The complementary value CRV may correspond to two's complement of the random value RV. The multiplexer 560 may provide the adder 510 with one of the random value RV and the complementary value CRV in response to a selection signal S Sl.

Therefore, the adder 510 may change the updated count data UCNTD randomly by adding one of the random value RV and the complementary value CRV to a value in which the read count data CNTD is increased by one during the store signal STR is activated. That is, the adder 510 may change the updated count data UCNTD randomly by adding the random value RV to a value in which the read count data CNTD is increased by one or subtracting the random value RV from a value in which the read count data CNTD is increased by one when the store signal STR is activated. The store signal STR may correspond to an event signal.

The random value generator 540*b* may include a timer 545 that is enabled during a first time interval in response to the store signal STR being activated. The random value generator 540*b* may generate the random value RV during the first time interval after the alert signal ALRT is activated, and the adder 510 may change the updated count data UCNTD randomly by adding the random value RV to a value in which the read count data CNTD is increased by one or subtracting the random value RV from a value in which the read count data CNTD is increased by one after the store signal STR is activated.

Figure 10:
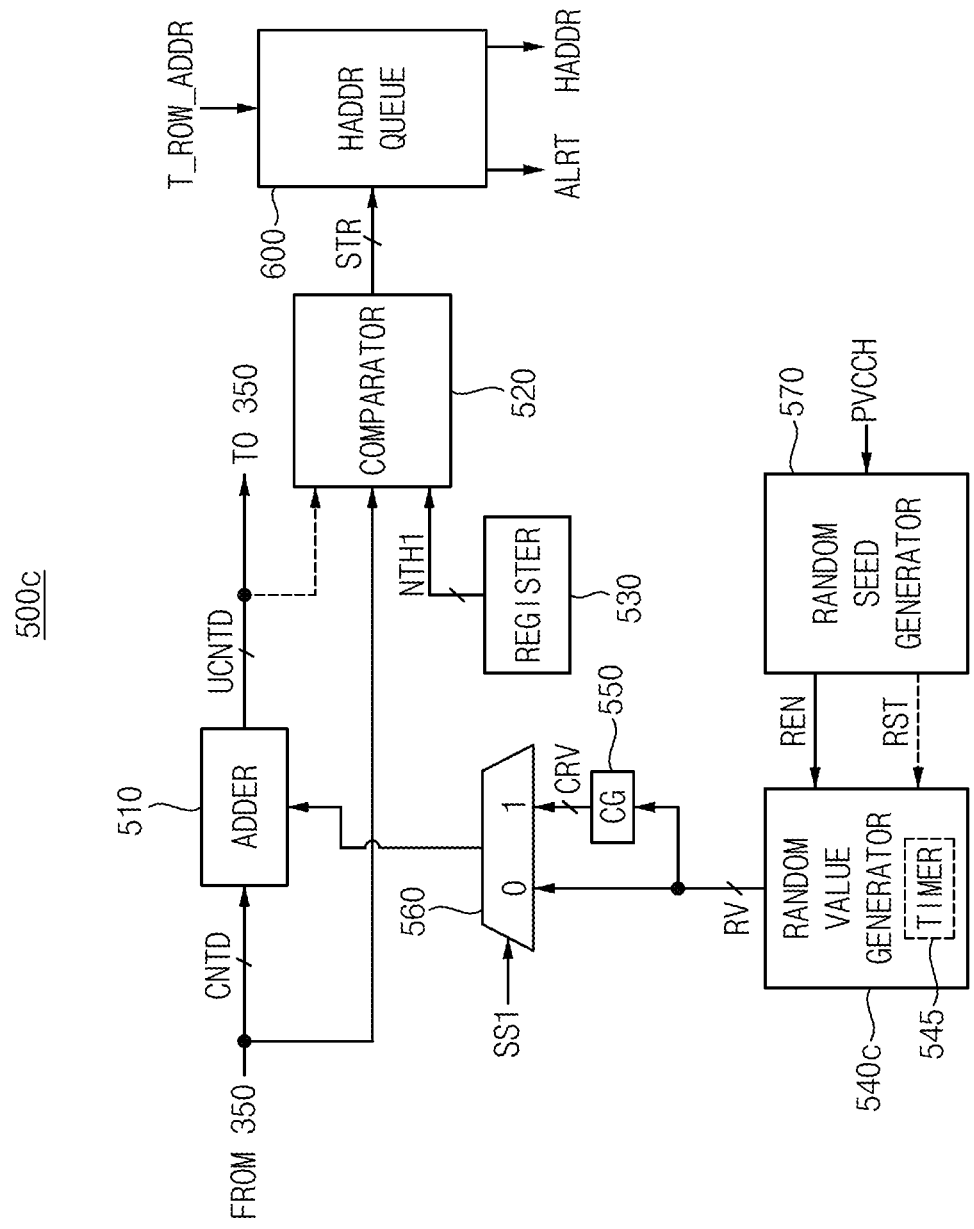
FIG. 10 is a block diagram illustrating an example of the row hammer management circuit in the semiconductor memory device of FIG. 3 according to example embodiments.

FIG. 10 is a block diagram illustrating an example of the row hammer management circuit in the semiconductor memory device of FIG. 3 according to example embodiments.

Referring to FIG. 9, a row hammer management circuit 500*c* may include an adder 510, a comparator 520, a register 530, a random value generator 540*c*, a complementary value generator 550, a multiplexer 560, a random seed generator 570 and the hammer address queue 600.

In FIG. 10, descriptions repeated with FIG. 8 will be omitted.

The random seed generator 570 may generate a random enable signal REN to the random value generator 540*c* based on the power stabilizing signal PVCCH.

The random value generator 540*c* may generate a random value RV in response to the random enable signal REN being activated. The complementary value generator 550 may generate a complementary value CRV of the random value RV by inverting the random value RV. The complementary value CRV may correspond to two's complement of the random value RV. The multiplexer 560 may provide the adder 510 with one of the random value RV and the complementary value CRV in response to a selection signal S Sl.

Therefore, the adder 510 may change the updated count data UCNTD randomly by adding one of the random value RV and the complementary value CRV to a value in which the read count data CNTD is increased by one in response to the random enable signal REN being activated. That is, the adder 510 may change the updated count data UCNTD randomly by adding the random value RV to a value in which the read count data CNTD is increased by one or subtracting the random value RV from a value in which the read count data CNTD is increased by one in response to the random enable signal REN being activated.

The random value generator 540*c* may include a timer 545 that is enabled during a first time interval in response to the random enable signal REN being activated. The random value generator 540*b* may generate the random value RV during the first time interval after the random enable signal REN is activated, and the adder 510 may change the updated count data UCNTD randomly by adding the random value RV to a value in which the read count data CNTD is increased by one or subtracting the random value RV from a value in which the read count data CNTD is increased by one after random enable signal REN is activated.

For example, the random seed generator 570 may provide the random value generator 540c with a reset signal RST to reset the random value generator 540c.

For example, the random seed generator 570 may be implemented based on a Pseudo Random Binary Sequence (PRBS) or using a Linear Feedback Shift Register (LFSR).

Figure 11:
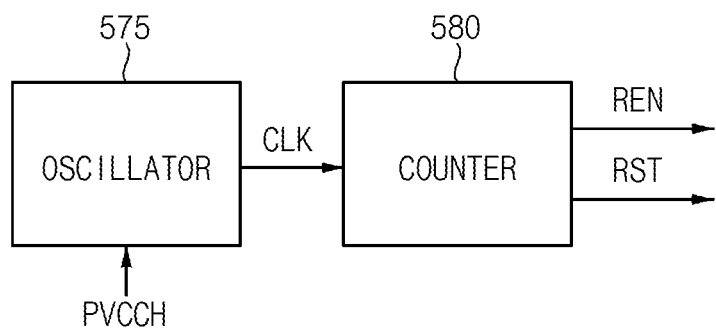
FIG. 11 is a block diagram illustrating an example of the random seed generator in the row hammer management circuit of FIG. 10 according to example embodiments.

FIG. 11 is a block diagram illustrating an example of the random seed generator in the row hammer management circuit of FIG. 10 according to example embodiments.

Referring to FIG. 11, the random seed generator 570 may include an oscillator 575 and a counter 580.

The oscillator 575 may operate in the power-up sequence in response to the power stabilizing signal PVCCH to generate a clock signal CLK toggling with a first frequency. The counter 580 may activate the random enable signal REN when the toggling of the clock signal CLK is counted to a predetermined number, and may activate the reset signal RST when a second time interval elapses after the random enable signal REN is activated.

Figure 12:
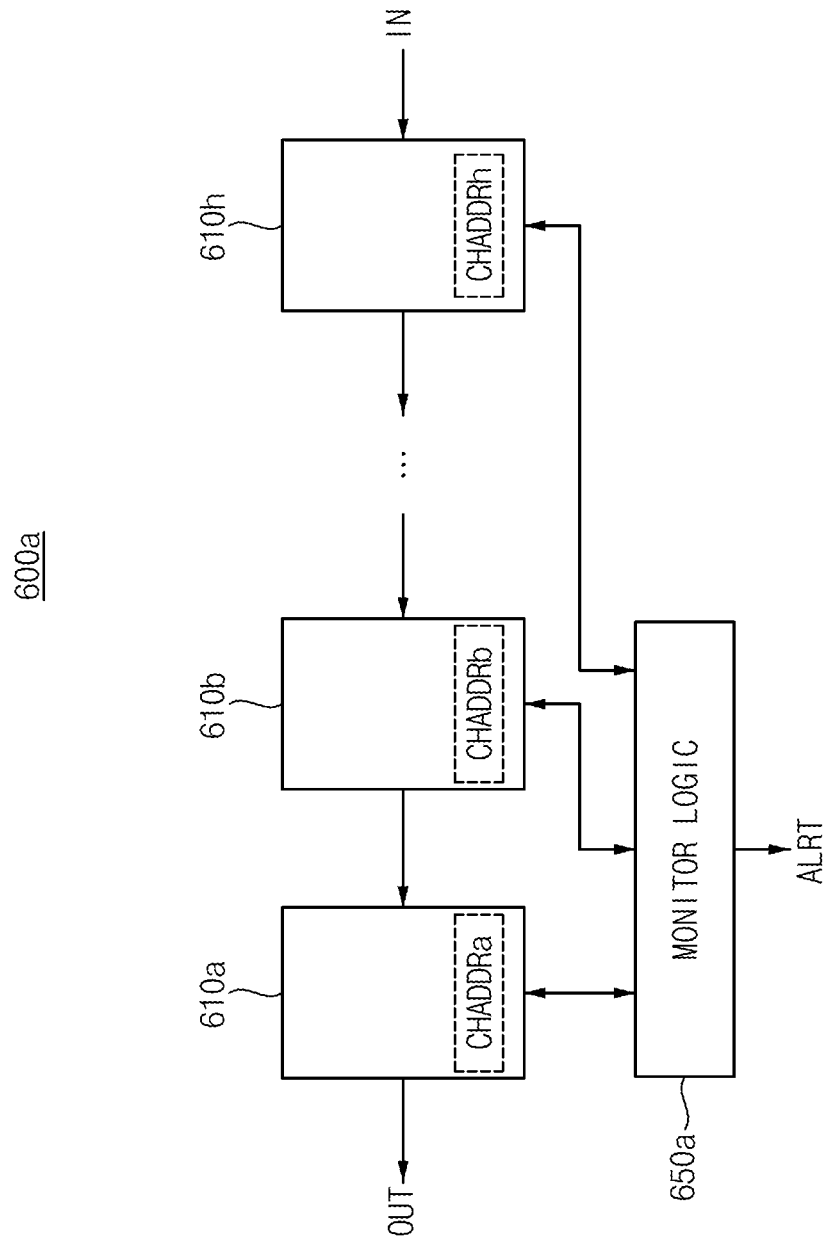
FIG. 12 illustrates an example of the hammer address queue in the row hammer management circuit of FIGS. 8 through 10 according to example embodiments.

FIG. 12 illustrates an example of the hammer address queue in the row hammer management circuit of FIGS. 8 through 10 according to example embodiments.

Referring to FIG. 12, a hammer address queue 600a may include a plurality of FIFO registers 610a, 610b, . . . , 610h, and a monitor logic 650a. A number of the plurality of FIFO registers 610a, 610b, . . . , 610h may correspond to a first number.

The plurality of FIFO registers 610a, 610b, . . . , 610h may store a plurality of candidate hammer addresses CHADDRa, CHADDRb, . . . , CHADDRh up to the first number based on FIFO scheme from an input terminal IN to an output terminal OUT.

The monitor logic 650a may be connected to the plurality of FIFO registers 610a, 610b, . . . , 610h, may manage the plurality of FIFO registers 610a, 610b, . . . , 610h and may monitor whether each of the plurality of FIFO registers 610a, 610b, . . . , 610h stores a candidate hammer address. In response to the number of the candidate hammer addresses stored in the plurality of FIFO registers FIFO registers 610a, 610b, . . . , 610h reaching the first number (that is, in response to the plurality of FIFO registers FIFO registers being full), the monitor logic 650a may output a candidate hammer address that is input first of all from among the candidate hammer addresses as the hammer address HADDR and may notify the memory controller 30 of a state of the hammer address queue 600a by transitioning a logic level of the alert signal ALRT from a first logic level to a second logic level different from the first logic level in response to outputting the hammer address HADDR.

In response to a transition of the alert signal ALRT, the memory controller 30 of FIG. 2 applies a refresh management command to the semiconductor memory device 200, and the monitor logic 650a may transition the alert signal ALRT to the first logic level in response to the hammer refresh operation based on the hammer address HADDR is completed. That is, the monitor logic 650a may transition the alert signal ALRT to the first logic level in response to the hammer refresh operation after a predetermined time interval elapses from a time point at which the monitor logic 650a outputs the hammer address HADDR.

Figure 13:
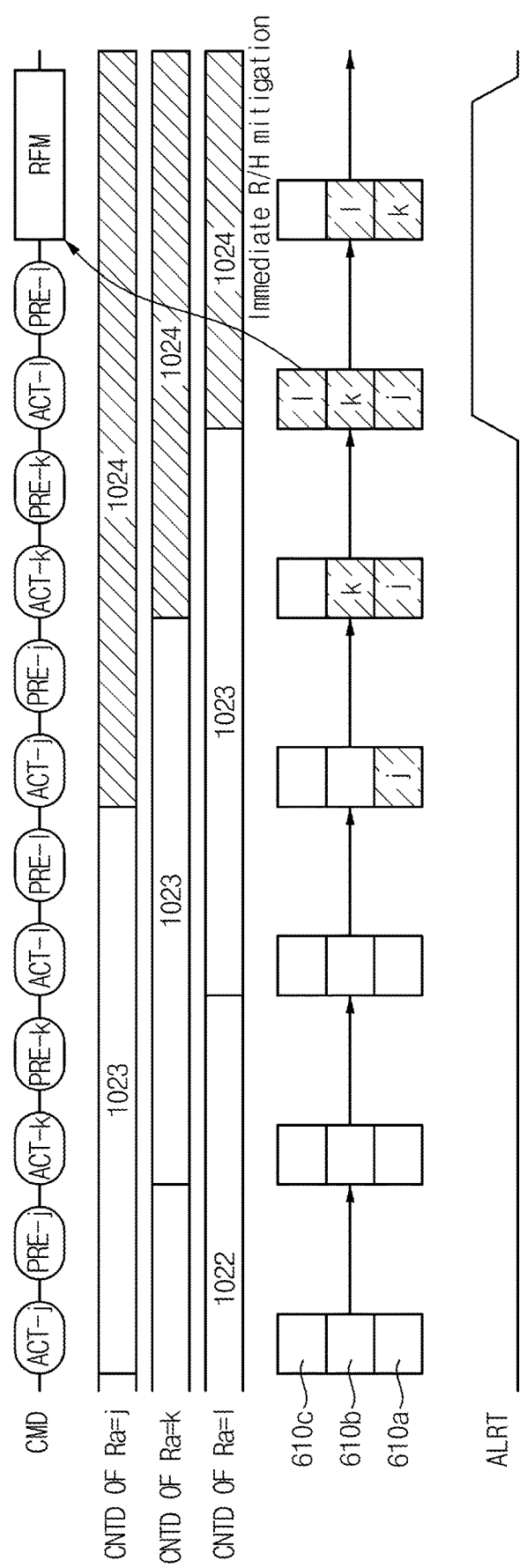
FIG. 13 is a timing diagram illustrating an example operation of the hammer address queue of FIG. 12 according to example embodiments.

FIG. 13 is a timing diagram illustrating an example operation of the hammer address queue of FIG. 12 according to example embodiments.

In FIG. 12, it is assumed that the plurality of FIFO registers 610a, 610b, . . . , 610h in FIG. 12 include three FIFO registers 610a, 610b and 610c and accesses on memory cell rows designated by a row address RA=j, a row address RA=k and a row address RA=l are repeated. In addition, it is assumed that the first reference number of times NTH1 corresponds to 1024.

In FIG. 13, ACT-j denotes an active command accompanying the row address RA=j, PRE-j denotes a precharge command on a memory cell row designated by the row address RA=j, ACT-k denotes an active command accompanying the row address RA=k PRE-k denotes a precharge command on a memory cell row designated by the row address RA=k, ACT-l denotes an active command accompanying the row address RA=l, and PRE-l denotes a precharge command on a memory cell row designated by the row address RA=l.

Referring to FIGS. 12 and 13, in response to the counted value (i.e., the count data CNTD) associated with the memory cell row designated by the row address RA=j reaching 1024, the row address RA=j is stored in the FIFO register 610a as a candidate hammer address, in response to the counted value (i.e., the count data CNTD) associated with the memory cell row designated by the row address RA=k reaching 1024, the row address RA=k is stored in the FIFO register 610b as a candidate hammer address, and in response to the counted value (i.e., the count data CNTD) associated with the memory cell row designated by the row address RA=l reaching 1024, the row address RA=l is stored in the FIFO register 610a as a candidate hammer address.

Because all of the FIFO registers 610a, 610b and 610c store candidate hammer addresses, the monitor logic 650a notifies the memory controller 30 of the hammer address queue 600a being full (that is, there being no available space in the hammer address queue 600a) by transitioning the alert signal ALRT to the second logic level. The memory controller in response to transition of the alert signal ALRT, may withhold application of the active command to the semiconductor memory device 200 and may apply a refresh management command RFM to the semiconductor memory device 200. The monitor logic 650a may transition the alert signal ALRT from the first logic level (i.e., a logic high level) to the second logic level (i.e., a logic low level) in response to the row address RA=j stored in the FIFO register 610a being output as the hammer address.

The refresh control circuit 400 in FIG. 5 may perform a hammer refresh operation on one or more victim memory cell rows which are physically adjacent to a memory cell row corresponding to the hammer address and the monitor logic 650a may transition the alert signal ALRT to the first logic level after the hammer refresh operation is completed. The hammer refresh operation is represented by Immediate R/H mitigation in FIG. 13.

When the accesses on the row addresses RA=j, RA=k and RA=l are caused by a malicious hacker, overflow occurs in the hammer address queue 600a and performance of the semiconductor memory device 200 may be degraded.

Figure 14:
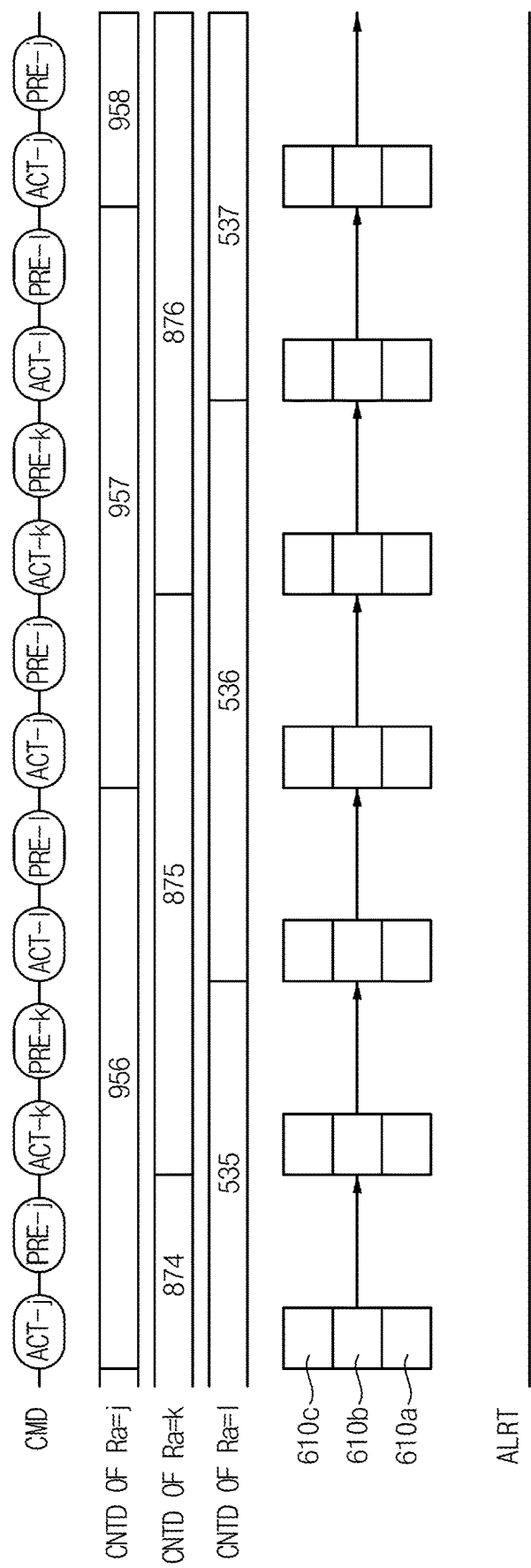
FIG. 14 is a timing diagram illustrating an example operation of the hammer address queue of FIG. 12 according to example embodiments.

FIG. 14 is a timing diagram illustrating an example operation of the hammer address queue of FIG. 12 according to example embodiments.

In FIG. 14, it is assumed that the plurality of FIFO registers 610a, 610b, . . . , 610h in FIG. 10 include three FIFO registers 610a, 610b and 610c and accesses on memory cell rows designated by a row address RA=j, a row address RA=k and a row address RA=l are repeated. In addition, it is assumed that the first reference number of times NTH1 corresponds to 1024. In addition, it is assumed that the random count data is stored in count cells of memory cell rows designated by the row addresses RA=j, RA=k and RA=l during a power-up sequence of the semiconductor memory device 200.

Referring to FIGS. 12 and 14, when the random count data that is stored in count cells of memory cell rows designated by the row addresses RA=j, RA=k and RA=l is changed randomly by adding the random value RV to the count data CNTD, the counted value (i.e., the count data CNTD) associated with the memory cell row designated by the row address RA=j corresponds to 958, the counted value (i.e., the count data CNTD) associated with the memory cell row designated by the row address RA=k corresponds to 873 and the counted value (i.e., the count data CNTD) associated with the memory cell row designated by the row address RA=l corresponds to 537. Therefore, overflow does not occur in the hammer address queue 600a and the alert signal ALRT may be maintained with the first logic level.

Figure 15:
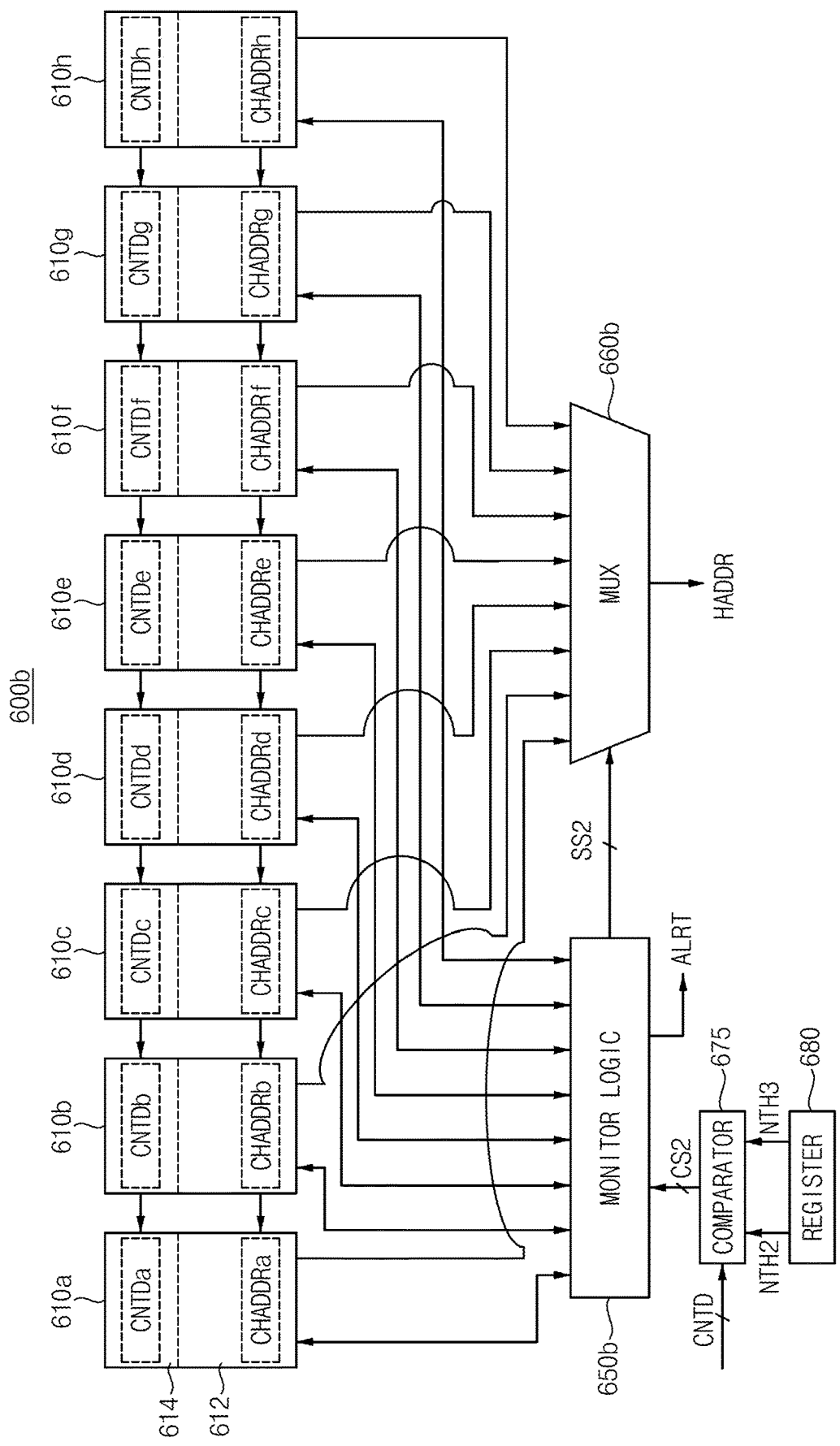
FIG. 15 illustrates an example of the hammer address queue in the row hammer management circuit of FIGS. 8 through 10 according to example embodiments.

FIG. 15 illustrates an example of the hammer address queue in the row hammer management circuit of FIGS. 8 through 10 according to example embodiments.

Referring to FIG. 15, a hammer address queue 600b may include a plurality of FIFO registers 610a, 610b, 610c, 610d, 610e, 610f, 610g and 610h, a monitor logic 650b, a multiplexer 660b, a comparator 675 and a register 680. A number of the plurality of FIFO registers 610a, 610b, 610c, 610d, 610e, 610f, 610g and 610h may correspond to the first number.

Each of the plurality of FIFO registers 610a, 610b, 610c, 610d, 610e, 610f, 610g and 610h may store a respective one of a plurality of candidate hammer addresses CHADDRa, CHADDRb, CHADDRc, CHADDRd, CHADDRe, CHADDRf, CHADDRg and CHADDRh, each of whose number of times of access is equal to or greater than the first reference number of times NTH1, and may store a respective one of additional number of times access associated with each of the candidate hammer addresses CHADDRa, CHADDRb, CHADDRc, CHADDRd, CHADDRe, CHADDRf, CHADDRg and CHADDRh after the candidate hammer addresses CHADDRa, CHADDRb, CHADDRc, CHADDRd, CHADDRe, CHADDRf, CHADDRg and CHADDRh being stored in the plurality of FIFO registers 610a, 610b, 610c, 610d, 610e, 610f, 610g and 610h as respective one of count data CNTDa, CNTDb, CNTDc, CNTDd, CNTDe, CNTDf, CNTDg and CNTDh, based on FIFO scheme.

The monitor logic 650b may be connected to the plurality of FIFO registers 610a, 610b, 610c, 610d, 610e, 610f, 610g and 610h, may manage the plurality of FIFO registers 610a, 610b, 610c, 610d, 610e, 610f, 610g and 610h and may monitor whether each of the plurality of FIFO registers 610a, 610b, 610c, 610d, 610e, 610f, 610g and 610h stores a candidate hammer address.

The register 680 may store a second reference number of times NTH2 greater than the first reference number of times NTH1 and a third reference number of times NTH3 greater than the second reference number of times NTH2 and may provide the second reference number of times NTH2 and the third reference number of times NTH3 to the comparator 675.

The comparator 675 may compare the each of the count data CNTDa, CNTDb, CNTDc, CNTDd, CNTDe, CNTDf, CNTDg and CNTDh stored in each of the plurality of FIFO registers 610a, 610b, 610c, 610d, 610e, 610f, 610g and 610h as the count data CNTD with the second reference number of times NTH2 and the third reference number of times NTH3 to generate (i.e., output) a second comparison signal CS2 and may provide the second comparison signal CS2 to the monitor logic 650c. The second comparison signal CS2 may include a plurality of bits and may indicate whether the count data CNTD is large or smaller with respect to the second reference number of times NTH2 and the third reference number of times NTH3.

The monitor logic 650b may generate a selection signal SS2 associated with selecting a first candidate hammer address corresponding to the count data exceeding the second reference number of times NTH2, from among the candidate hammer addresses CHADDRa, CHADDRb, CHADDRc, CHADDRd, CHADDRe, CHADDRf, CHADDRg and CHADDRh, based on the second comparison signal CS2 and may provide the selection signal SS2 to the multiplexer 660b. The monitor logic 650b may generate the selection signal SS2 associated with selecting a second candidate hammer address corresponding to the count data exceeding the third reference number of times NTH3, from among the candidate hammer addresses CHADDRa, CHADDRb, CHADDRc, CHADDRd, CHADDRe, CHADDRf, CHADDRg and CHADDRh, based on the second comparison signal CS2, may provide the selection signal SEL2 to the multiplexer 660b and may transition a logic level of the alert signal ALRT from the first logic level to the second logic level.

The multiplexer 660b may receive the candidate hammer addresses CHADDRa, CHADDRb, CHADDRc, CHADDRd, CHADDRe, CHADDRf, CHADDRg and CHADDRh and may output the first candidate hammer address corresponding to the count data exceeding the second reference number of times NTH2 as the hammer address HADDR or may output the second candidate hammer address corresponding to the count data exceeding the third reference number of times NTH3 as the hammer address HADDR based on the selection signal SS2.

When the hammer address queue 600b outputs the first candidate hammer address as the hammer address HADDR, the refresh control circuit 400 in FIG. 3 may perform the hammer refresh operation on two victim memory cell rows which are physically adjacent to a first memory cell row corresponding to the first candidate hammer address at normal refresh timings on the plurality of memory cell rows.

When the hammer address queue 600b outputs the second candidate hammer address as the hammer address HADDR, the memory controller 30, in response to transition of the alert signal ALRT, may withhold application of the active command to the semiconductor memory device 200 and may apply a refresh management RFM command to the semiconductor memory device 200. The refresh control circuit 400 in FIG. 3 may perform the hammer refresh operation on four victim memory cell rows which are physically adjacent to a second memory cell row corresponding to the second candidate hammer in response to the refresh management signal RFMS.

The monitor logic 650b may transition the alert signal ALRT to the first logic level in response to the hammer refresh operation based on the hammer address HADDR is completed. That is, the monitor logic 650b may transition the alert signal ALRT to the first logic level in response to the hammer refresh operation after a predetermined time interval elapses from a time point at which the monitor logic 650b outputs the hammer address HADDR.

Each of the plurality of FIFO registers 610a, 610b, 610c, 610d, 610e, 610f, 610g and 610h may include a first region 612 to store a candidate hammer address such as the candidate hammer address CHADDRa and a second region 614 to store a count data such as the additional count data CNTDa.

Although it is described as the hammer address queue 600 is included in the row hammer management circuit 500 with reference to FIGS. 8 through 10, 12 and 15, a number of the hammer address queue 600 may correspond to a number of the bank arrays 310a~310s and one hammer address queue may be associated with one bank array. Therefore, when a first hammer address queue of the plurality of hammer address queue is full, the first hammer address queue transitions a corresponding alert signal to a second logic level, the memory controller 30 applies the RFM command to a bank array associated with the first hammer address queue and other bank arrays perform normal operation.

Figure 16:
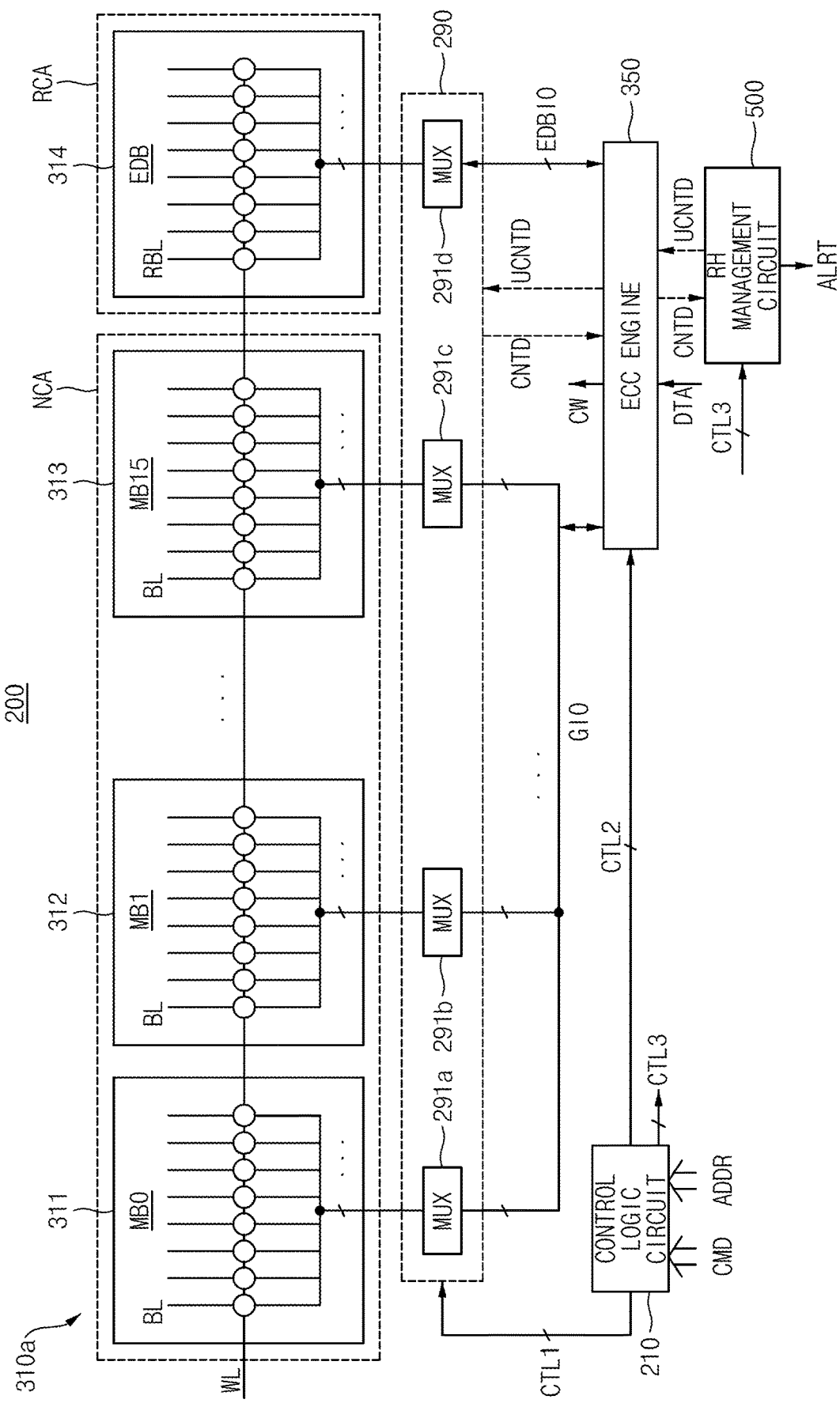
FIG. 16 illustrates a portion of the semiconductor memory device of FIG. 3 for explaining a write operation.

FIG. 16 illustrates a portion of the semiconductor memory device of FIG. 3 for explaining a write operation.

In FIG. 16, the control logic circuit 210, the first bank array 310a, the I/O gating circuit 290, the ECC engine 350 and the row hammer management circuit 500 are illustrated.

Referring to FIG. 16, the first bank array 310a includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. Each of the first memory blocks 311~313 includes memory cells coupled to a word-line WL and bit-lines BL and the second memory block 314 includes memory cells coupled to word-line WL and redundancy bit-lines RBL. The first memory blocks 311~313 and the second memory block 314 may each be representative of a sub array block SCB in FIG. 12.

The I/O gating circuit 290 includes a plurality of switching circuits 291a~291d respectively connected to the first memory blocks 311~313 and the second memory block 314.

The ECC engine 350 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d, the second control signal CTL2 for controlling the ECC engine 350 and the third control signal CTL3 for controlling the row hammer management circuit 500.

When the command CMD is a write command, the control logic circuit 210 provides the second control signal CTL2 to the ECC engine 350. The ECC engine 350 performs the ECC encoding on the data DTA to generate parity data associated with the data DTA and provides the I/O gating circuit 290 with the codeword CW including the data DTA and the parity data. The control logic circuit 210 provides the first control signal CTL1 to the I/O gating circuit 290 such that the codeword CW is to be stored in a sub-page of the target page in the first bank array 310a.

When the command CMD that is received after the write command corresponds to the precharge command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290. When the row hammer management circuit 500 updates the count data CNTD, the row hammer management circuit 500 changes the count data CNTD randomly by adding the random value to the count data CNTD or by subtracting the random value from the count data CNTD and provides the updated count data UCNTD to the ECC engine 350.

That is, the ECC engine 350 and row hammer management circuit 500 may perform the internal read-update-write operation to read the count data CNTD, to update the read count data and to write the updated count data, in response to the precharge command In addition, the row hammer management circuit 500, in response to all of the FIFO registers storing the candidate hammer addresses, each of whose number of times of access is equal to or greater than the first reference number of times NTH1, may notify the memory controller 30 of states of the FIFO registers by transitioning a logic level of the alert signal ALRT from the first logic level to the second logic level.

Figure 17:
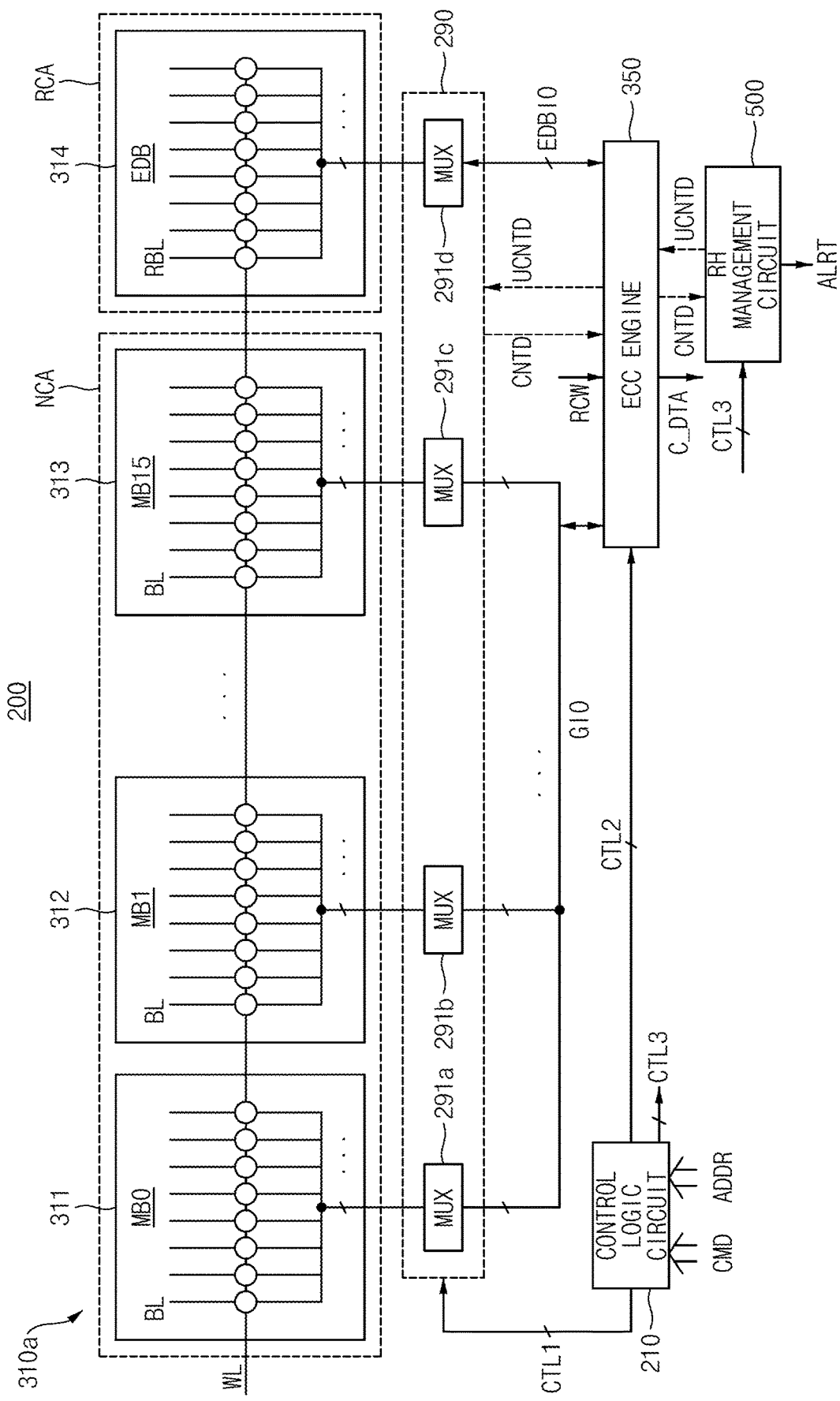
FIG. 17 illustrates a portion of the semiconductor memory device of FIG. 3 for explaining a read operation. Description repeated with FIG. 16 will be omitted.

FIG. 17 illustrates a portion of the semiconductor memory device of FIG. 3 for explaining a read operation. Description repeated with FIG. 16 will be omitted.

Referring to FIG. 17, when the command CMD is a read command to designate a read operation, the control logic circuit 210 provides the first control signal CTL1 to the I/O gating circuit 290 such that a (read) codeword RCW stored in the sub-page of the target page in the first bank array 310a is provided to the ECC engine 350.

When the command CMD that is received after the write command corresponds to the precharge command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290. When the row hammer management circuit 500 updates the count data CNTD, the row hammer management circuit 500 changes the count data CNTD randomly by adding the random value to the count data CNTD or by subtracting the random value from the count data CNTD and provides the updated count data UCNTD to the ECC engine 350.

That is, the ECC engine 350 and row hammer management circuit 500 may perform the internal read-update-write operation to read the count data CNTD, to update the read count data and to write the updated count data, in response to the precharge command In addition, the row hammer management circuit 500, in response to all of the FIFO registers storing the candidate hammer addresses, each of whose number of times of access is equal to or greater than the first reference number of times NTH1, may notify the memory controller 30 of states of the FIFO registers by transitioning a logic level of the alert signal ALRT from the first logic level to the second logic level.

Figure 18:
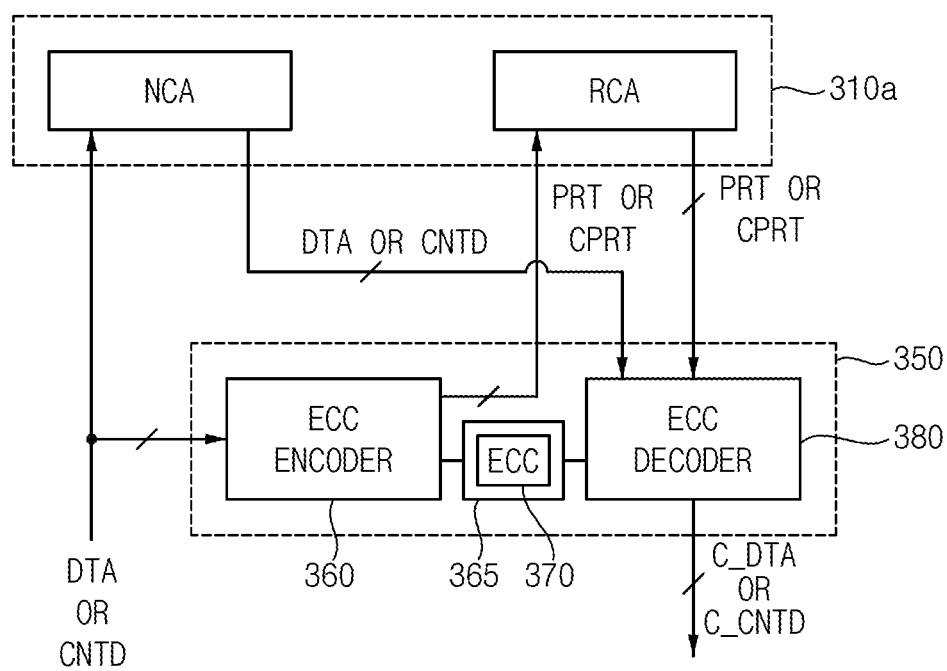
FIG. 18 is a block diagram illustrating an example of the ECC engine in the semiconductor memory device of FIG. 16 or FIG. 17 according to example embodiments.

FIG. 18 is a block diagram illustrating an example of the ECC engine in the semiconductor memory device of FIG. 16 or FIG. 17 according to example embodiments.

Referring to FIG. 18, the ECC engine 350 may include an ECC encoder 360, an ECC decoder 380 and a (ECC) memory 365. The memory 365 may store an ECC 370. The ECC 370 may be a single error correction (SEC) code or a single error correction/double error detection (SECDED) code.

The ECC encoder 360 may receive the data DTA from the data I/O buffer 320 and generate parity data PRT using the ECC 370, associated with the data DTA to be stored in the normal cell array NCA of the first bank array 310*a*. The parity data PRT may be stored in the redundancy cell array RCA of the first bank array 310*a*. In addition, the ECC encoder 360 may receive the count data CNTD as an updated count data UCNTD from the row hammer management circuit 500 and generate count parity data CPRT using the ECC 370, associated with the count data CNTD (i.e., updated count data UCNTD) to be stored in the normal cell array NCA of the first bank array 310*a*. The count parity data CPRT may be stored in the redundancy cell array RCA of the first bank array 310*a*.

The ECC decoder 380 may perform an ECC decoding operation on a read data DTA based on the read data DTA and the parity data PRT read from the first bank array 310*a* using the ECC 370. When the read data DTA includes an error bit as a result of the ECC decoding, the ECC decoder 380 may correct the error bit in the read data DTA and may provide a corrected data C_DTA to the data I/O buffer 320.

In addition, the ECC decoder 380 may perform an ECC decoding operation on the count data CNTD based on the count data CNTD and the count parity data CPRT read from the first bank array 310*a* using the ECC 370. When the count data CNTD includes an error bit as a result of the ECC decoding, the ECC decoder 380 may correct the error bit in the count data CNTD and may provide a corrected count data C_CNTD to the row hammer management circuit 500.

Figure 19:
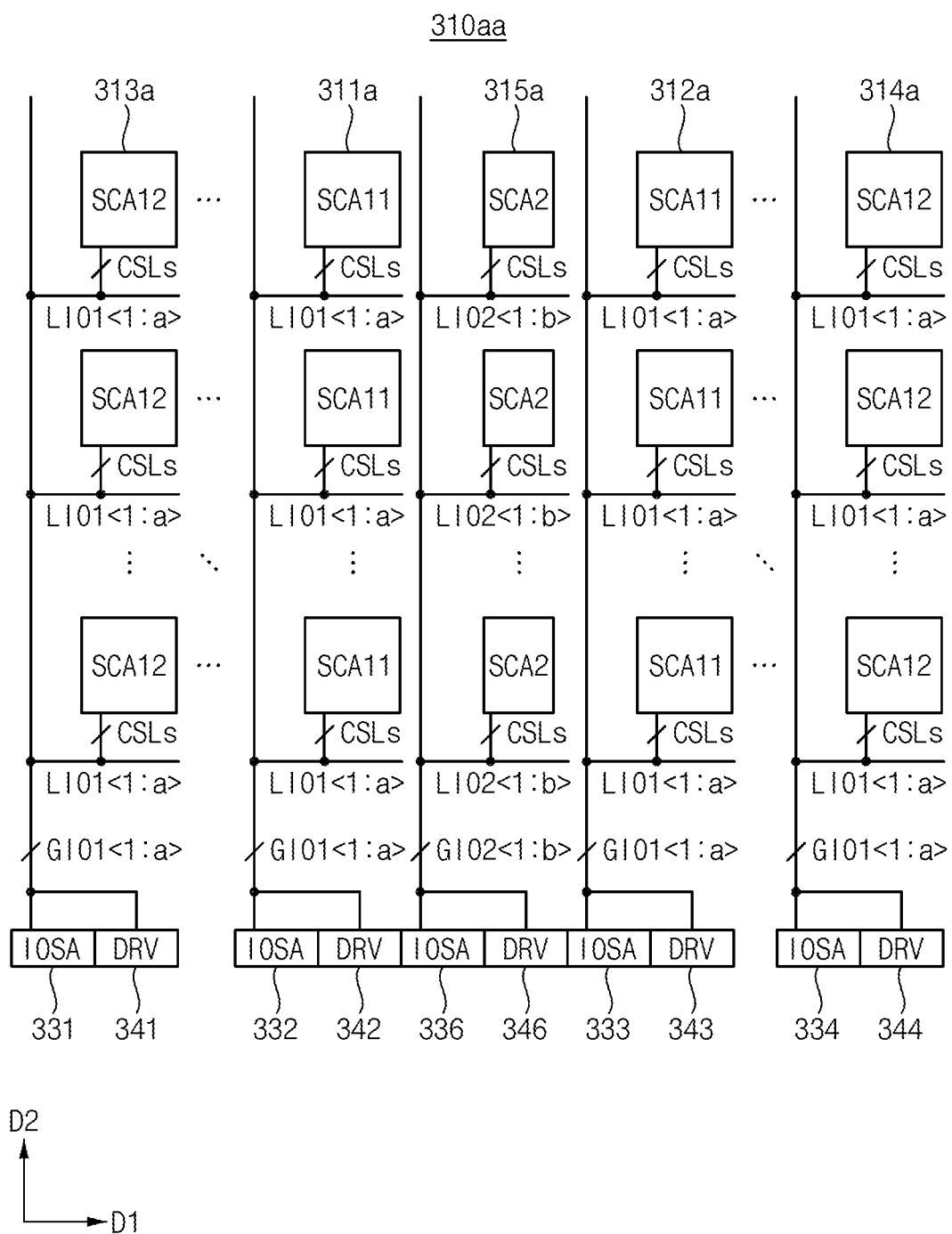
FIG. 19 is a block diagram illustrating an example of the first bank array in FIG. 3 according to example embodiments.

FIG. 19 is a block diagram illustrating an example of the first bank array in FIG. 3 according to example embodiments.

Referring to FIG. 19, a first bank array 310*aa* may include first sub array blocks SCA11 311*a* and 312*a*, second sub array blocks SCA12 313*a* and 314*a*, third sub array blocks SCA2 315*a*, I/O sense amplifiers 331, 332, 333, 334 and 336 and drivers 341, 342, 343, 344 and 346.

Data I/O for each of the first sub array blocks 311*a* and 312*a* and the second sub array blocks 313*a* and 314*a* may be performed through first global I/O lines GIO1<1:a> and first local I/O lines LIO1<1:a>. Here, a may be a natural number equal to or greater than 8. Depending on a read command or a write command, "a" bit-lines of each of the first sub array blocks 311*a* and 312*a* and the second sub array blocks 313*a* and 314*a* disposed in the first direction D1 may be selected by a column select signal transmitted through one of column select lines CSLs. The number of the first sub array blocks 311*a* and 312*a* and the second sub array blocks 313*a* and 314*a* may be different in other embodiments and, for example, may be determined depending on the number of bits of data the semiconductor memory device 200 is able to process.

Data I/O for the third sub array blocks 315*a* may be performed through second global I/O lines G1O2<1:b> and second local I/O lines LIO2<1:b>. Here, b may be a natural number smaller than a. Depending on a read command or a write command, "b" bit-lines of the third sub array blocks 315*a* may be selected by a column select signal that is transmitted through one of the column select lines CSLs. The number of the third sub array blocks 315*a* may be different in other embodiments.

In example embodiments, the first bank array 310*aa* may further include first sub array blocks, second sub array blocks and third sub array blocks disposed in the second direction D2.

In example embodiments, the first sub array blocks 311*a* and 312*a* may store normal data and the count data, the second sub array blocks 313*a* and 314*a* may store the normal data and the third sub array blocks 315*a* may store the parity data and the count parity data. The normal data may be, for example, data that the semiconductor memory device 200 receives from an external device or data that the semiconductor memory device 200 will provide to the external device.

The I/O sense amplifier 331 may sense and amplify voltages of the first global I/O lines GIO1<1:a>, which are determined depending on bits output through the first global I/O lines GIO1<1:a>. Each of the I/O sense amplifiers 332, 333, 334 and 336 may operate in a manner similar to the I/O sense amplifier 331. The I/O sense amplifier 336 may sense and amplify voltages of the second global I/O lines GIO2<1:b>, which are determined depending on bits output through the second global I/O lines GIO2<1:b>.

The driver 341 may provide data to memory cells of the first sub array blocks 313*a* through the first global I/O lines GIO1<1: a>, the first local I/O lines LIO1<1: a>, and "a" bit-lines selected by a column select signal transmitted through one of column select lines CSLs based on a write command. The data may include bits received through one data I/O pin, or may include bits received through a plurality of data I/O pins aligned at a rising edge or a falling edge of a data strobe signal.

The drivers 342, 343, 344 and 346 may operate in a manner substantially similar to the driver 341. The driver 346 may transmit the parity data or the count parity data to memory cells of the third sub array blocks 315*a* through the second global I/O lines GIO2<1:b>, the second local I/O lines LIO2<1:b>, and "b" bit-lines selected by a column select signal transmitted through one of column select lines CSLs.

FIGS. 20 through 22 illustrate example commands which may be used in the memory system of FIG. 1.

FIG. 20 illustrates combinations of a chip selection signal CS_n and first through fourteenth command-address signals CA0~CA13 representing an active command ACT, a write command WR and a read command RD, FIG. 21 illustrates combinations of the chip selection signal CS_n and the first through fourteenth command-address signals CA0~CA13 representing a write command WRA including an auto precharge and a read command RDA including an auto precharge, and FIG. 22 illustrates combinations of the chip selection signal CS_n and the first through fourteenth command-address signals CA0~CA13 representing precharge commands PREab, PREsb and PREpb.

In FIGS. 20 through 22, H indicates a logic high level, L indicates a logic low level, V indicates a valid logic level corresponding to one of the logic high level H and the logic low level L, R0~R17 indicate bits of a row address, BA0 through BA2 indicate bits of a bank address, BG0 through BG2 indicate bits of a bank group address, and CID0 through CID3 indicate die identifier of a memory die (or a memory chip) when the semiconductor memory device 200 is implemented with a stacked memory device including a plurality of memory dies. In addition, in FIGS. 20 and 21, C2~C10 indicate bits of a column address, in FIGS. 20 and 21, BLT indicates burst length flag and in FIG. 21, AP indicates auto precharge flag.

Referring to FIG. 20, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Referring to FIG. 21, the write command WRA including an auto precharge and the read command RDA including an auto precharge may be transferred during two cycles, for example, during the logic high level H and the logic low level L of the chip selection signal CS_n, and may include the bank address bits BA0 and BA1 and the column address bits C3~C10 or C2~C10. Either the tenth command-address signal CA9 or the eleventh command-address signal CA10 of the write command WRA including an auto precharge and the read command RDA including an auto precharge may be used as an active count update flag.

In FIG. 22, PREpb is a precharge command to precharge a particular bank in a particular bank group, PREab is an all bank precharge command to precharge all banks in all bank groups and PREsb is a same bank precharge command to precharge the same bank in all bank groups.

Referring to FIG. 22, the ninth command-address signal CA8 or the tenth command-address signal CA9 of each of the precharge commands PREab and PREsb may be uses as an active count update flag designating the internal read-update-write operation.

Figure 23:
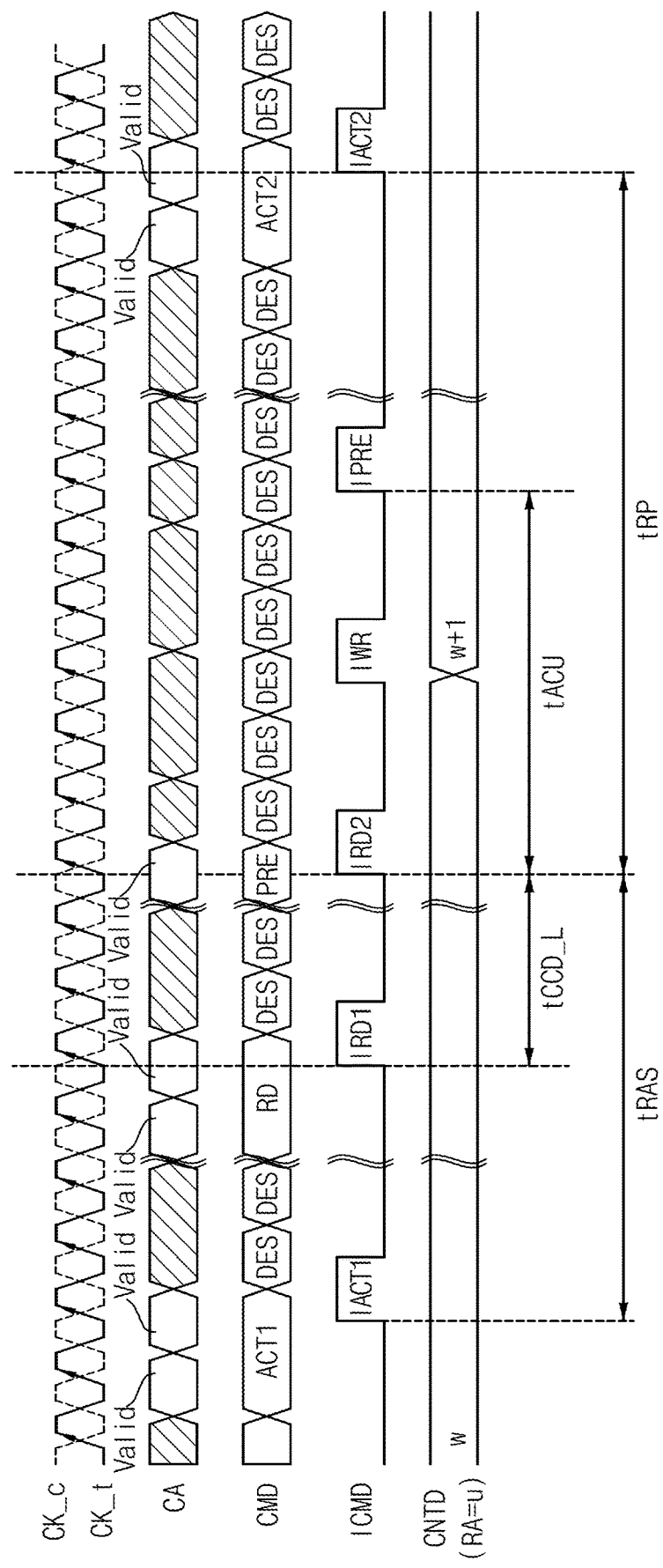
FIGS. 23 and 24 illustrate examples of command protocols of the memory system when the memory system uses the active count update command, respectively.
Figure 24:
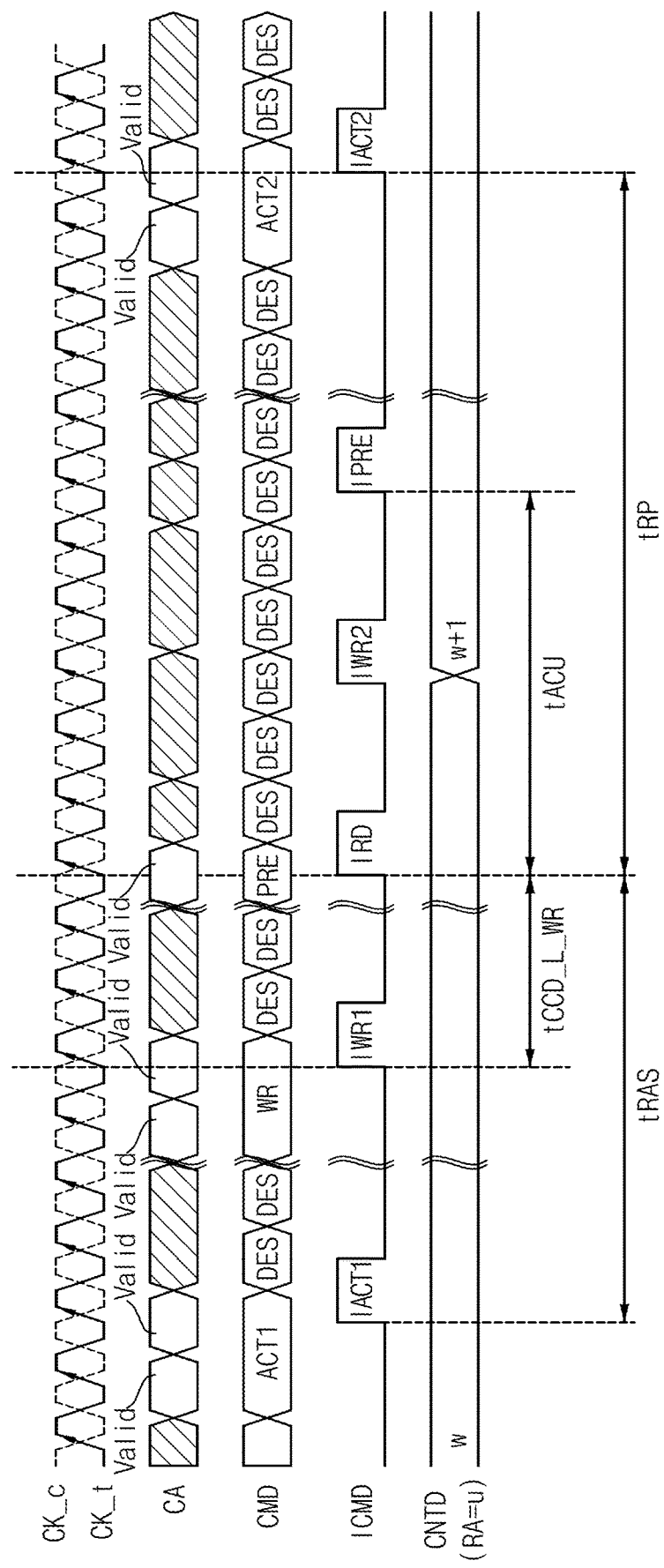

FIGS. 23 and 24 illustrate examples of command protocols of the memory system when the memory system uses the active count update command, respectively.

In FIGS. 23 and 24, differential clock signal pair CK_t and CK_c are illustrated.

Referring to FIGS. 1, 2, 3 and 23, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a read command RD designating a read operation on the first target memory cell row to the semiconductor memory device 200 in synchronization with an edge of the clock signal CK_t. The control logic circuit 210, in response to the read command RD, performs a read operation on data stored in the first target memory cell row by enabling a first read signal IRD1.

After a time interval corresponding to a delay time of consecutive read commands to the same bank group tCCD_L from applying the read command RD, the scheduler 55 applies a prechage command PRE to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a second read signal IRD2 and a write signal IWR in response to the prechage command PRE. Therefore, bit values stored in the first target memory cell row designated by the first target row address (e.g., RA=u) is increased by one from w to w+1.

After a time interval corresponding to a time tACU of performing the internal read-update-write operation from applying the prechage command PRE, the control logic circuit 210, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

In FIG. 23, tRAS corresponds to a time interval from active to precharge.

Referring to FIGS. 1, 2, 3 and 24, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a write command WR designating a write operation on the first target memory cell row to the semiconductor memory device 200 in synchronization with an edge of the clock signal CK_t. The control logic circuit 210, in response to the write command WR, performs a write operation to store data in the first target memory cell row by enabling a first write signal IWR1.

After a time interval corresponding to a delay time of consecutive write commands to the same bank group tCCD_L_WR from applying the write command WR, the scheduler 55 applies a precharge command PRE to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a read signal IRD and a second write signal IWR2 in response to the precharge command PRE. Therefore, bit values stored in the first target memory cell row designated by the first target row address (e.g., RA=u) is increased by one from w to w+1.

After a time interval corresponding to a time tACU of performing the internal read-update-write operation from applying the precharge command PRE, the control logic circuit 210 precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

Figure 25:
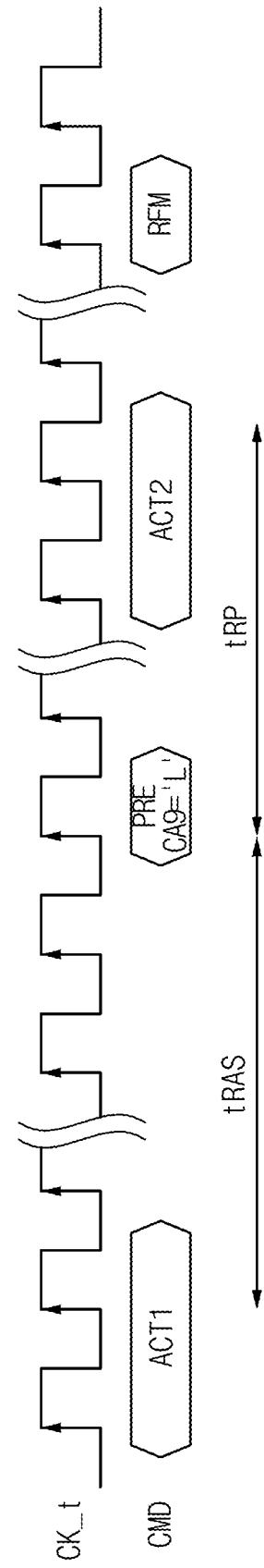
FIG. 25 illustrates an example of the command protocol of the memory system when the memory system updates the count data based on the precharge command.

FIG. 25 illustrates an example of the command protocol of the memory system when the memory system updates the count data based on the precharge command.

Referring to FIGS. 1, 2, 22 and 25, the scheduler 55 applies the first active command ACT1 to the semiconductor memory device 200 in synchronization with an edge of the clock signal CK_t, and applies the precharge command PRE designating an internal read-update-write operation on the count data stored in a target memory cell designated by a target row address accompanied by the first active command ACT1 to the semi conductor memory device 200 after a tRAS corresponding to active to precharge time elapses. In this case, the scheduler 55 may set the tenth command-address signal CA9 of the precharge command PRE to a logic low level L.

After a time interval corresponding to precharge time tRP, the scheduler 55 applies a second active command ACT2 to the semiconductor memory device 200 in synchronization with an edge of the clock signal CK_t and applies a refresh management command RFM to the semiconductor memory device 200. The semiconductor memory device 200 performs a hammer refresh operation two victim memory cell rows physically adjacent to a memory cell row corresponding to the hammer address, in response to the refresh management command RFM.

Figure 26:
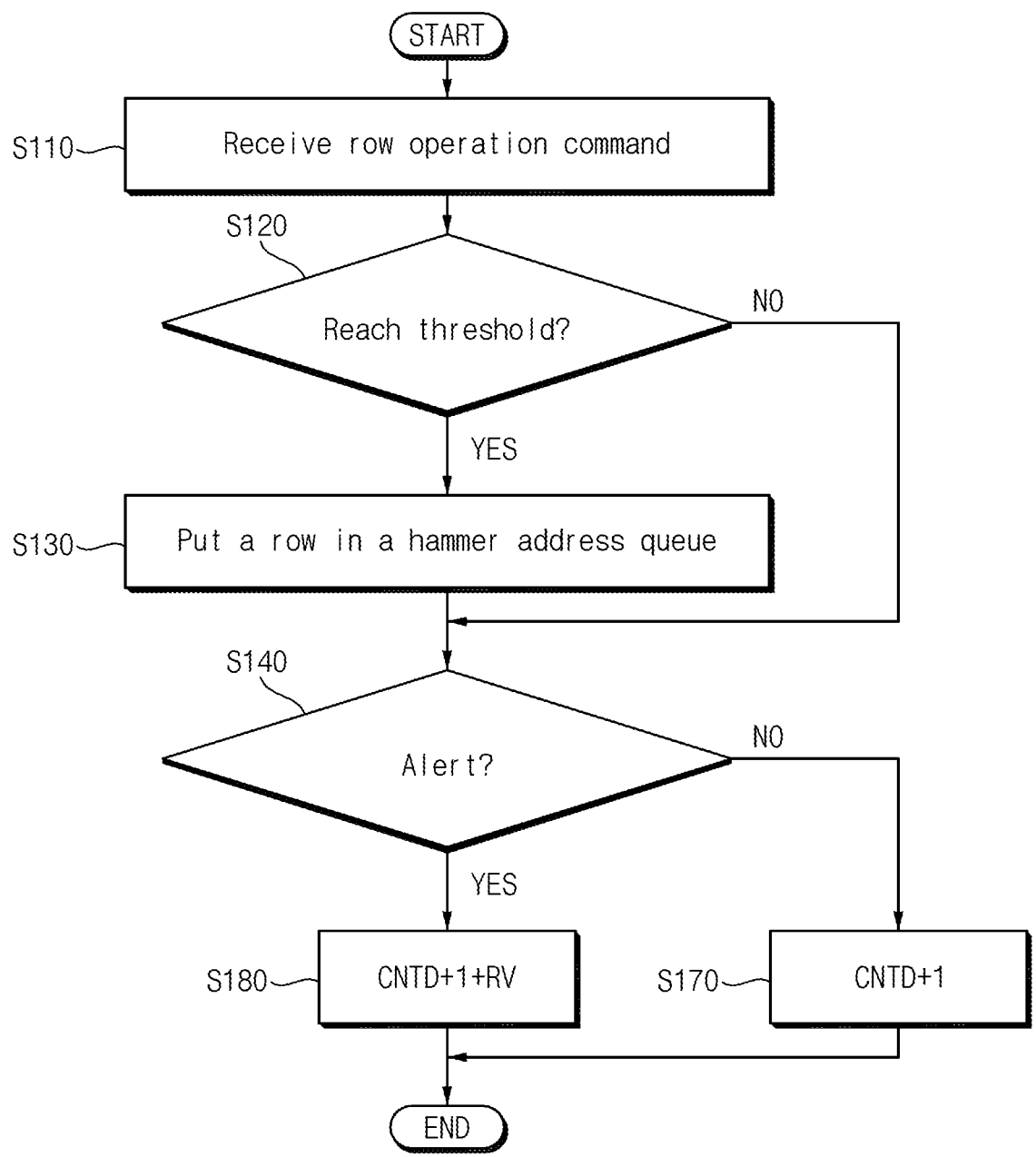
FIG. 26 illustrates operation of the row hammer management circuits of FIGS. 8 through 10 according to example embodiments.

FIG. 26 illustrates operation of the row hammer management circuits of FIGS. 8 through 10 according to example embodiments.

Referring to FIGS. 1 through 10 and 26, the semiconductor memory device 200 receives a row operation command from the memory controller (operation S110). The row operation command corresponds to a precharge command and may be applied to the semiconductor memory device 200 after the active command.

The row hammer management circuit 500 determines whether the counted value of a memory cell row associated with the precharge command reaches a threshold (i.e., the first threshold value NTH1) (operation S120).

When the counted value does not reach the threshold (NO in operation S120) or when the counted value reaches the threshold (YES in operation S120) and the row hammer management circuit 500 puts a row address of the memory cell row associated with the precharge command in the hammer address queue 600, the row hammer management circuit 500 determines whether to activate the alert signal ALRT (operation S140).

When the alert signal ALRT is not activated (NO in operation S140), the row hammer management circuit 500 increases the count data CNTD by one (operation S170). When the alert signal ALRT is activated (YES in operation S140), the row hammer management circuit 500 adds the random value RV to count data CNTD increased by one (operation S180) and thus, the row hammer management circuit 500 changes the count data CNTD randomly.

Figure 27:
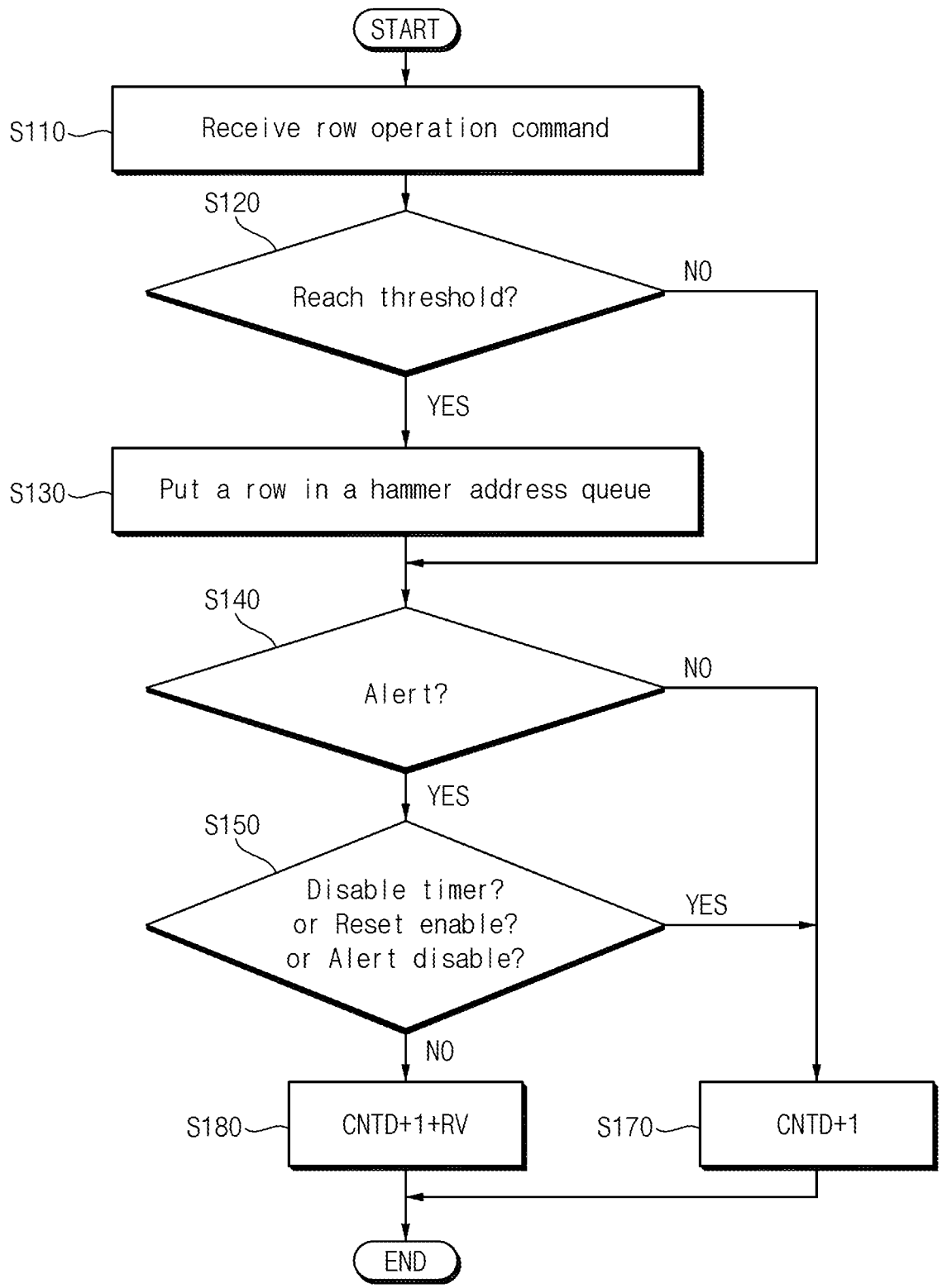
FIG. 27 illustrates operation of the row hammer management circuits of FIGS. 8 through 10 according to example embodiments.

FIG. 27 illustrates operation of the row hammer management circuits of FIGS. 8 through 10 according to example embodiments.

Referring to FIGS. 1 through 10 and 27, the semiconductor memory device 200 receives a row operation command from the memory controller (operation S110). The row operation command corresponds to a precharge command and may be applied to the semiconductor memory device 200 after the active command.

The row hammer management circuit 500 determines whether the counted value of a memory cell row associated with the precharge command reaches a threshold (i.e., the first threshold value NTH1) (operation S120).

When the counted value reaches the threshold (YES in operation S120), the row hammer management circuit 500 puts a row address of the memory cell row associated with the precharge command in the hammer address queue 600 (operation S130).

When the counted value does not reach the threshold (NO in operation S120) or after the row hammer management circuit 500 puts a row address of the memory cell row associated with the precharge command in the hammer address queue 600, the row hammer management circuit 500 determines whether to activate the alert signal ALRT (operation S140).

When the alert signal ALRT is not activated (NO in operation S140), the row hammer management circuit 500 increases the count data CNTD by one (operation S170). When the alert signal ALRT is activated (YES in operation S140), the row hammer management circuit 500 determines whether a condition of disabling randomization is satisfied (operation S150).

The condition of disabling randomization may include disabling the timer 545, activating the reset signal RST and/or deactivating the alert signal ALRT. When one of the disabling the timer 545, activating the reset signal RST and deactivating the alert signal ALRT is satisfied, the row hammer management circuit 500 determines that the condition of disabling randomization is satisfied.

When the condition of disabling randomization is satisfied (YES in operation S150), the row hammer management circuit 500 increases the count data CNTD by one (operation S170).

When the condition of disabling randomization is not satisfied (NO in operation S150), the row hammer management circuit 500 adds the random value RV to count data CNTD increased by one (operation S180) and thus, the row hammer management circuit 500 changes the count data CNTD randomly.

Figure 28:
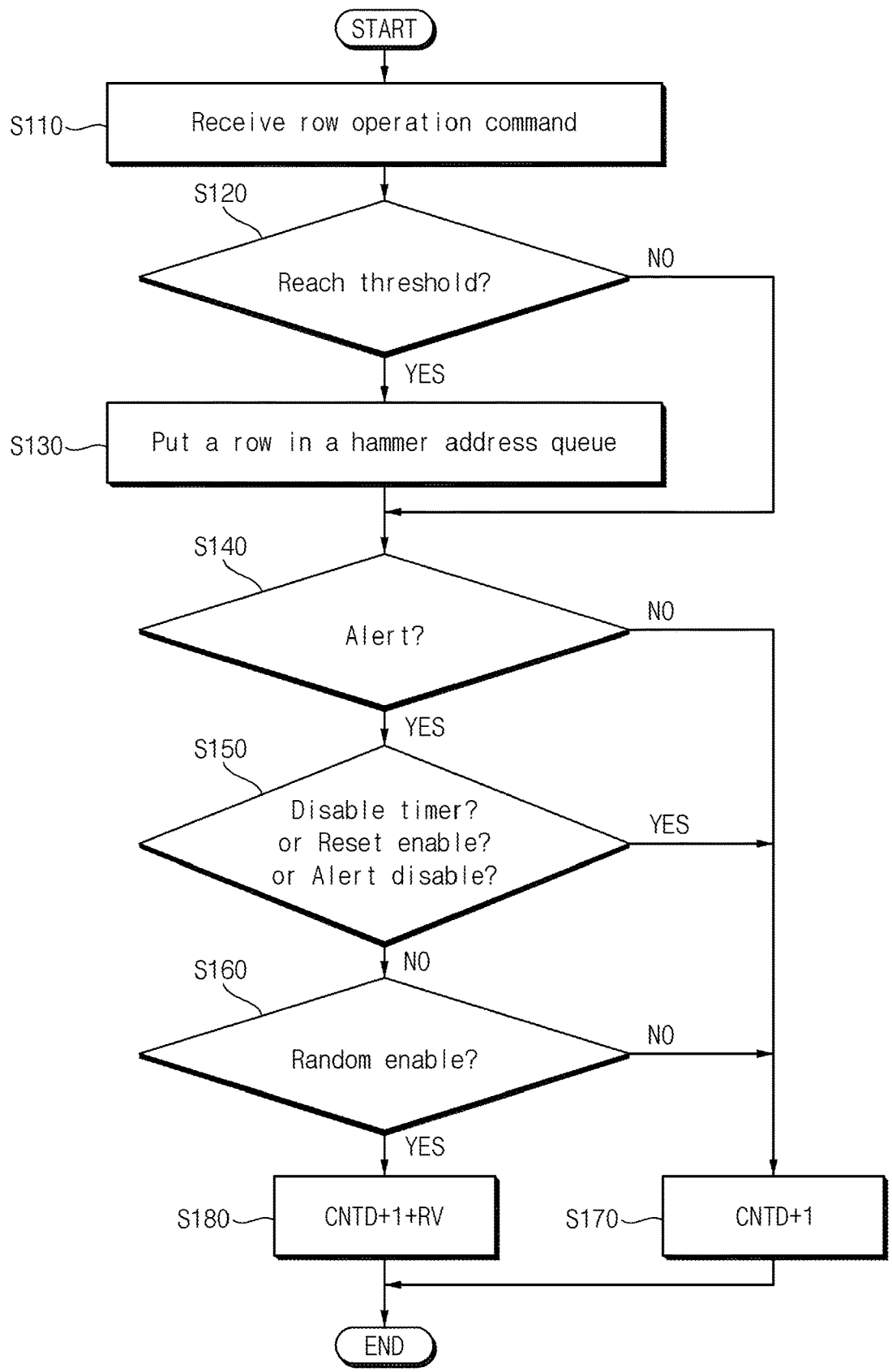
FIG. 28 illustrates operation of the row hammer management circuits of FIGS. 8 through 10 according to example embodiments.

FIG. 28 illustrates operation of the row hammer management circuits of FIGS. 8 through 10 according to example embodiments.

Referring to FIGS. 1 through 10 and 28, the semiconductor memory device 200 receives a row operation command from the memory controller (operation S110). The row operation command corresponds to a precharge command and may be applied to the semiconductor memory device 200 after the active command.

The row hammer management circuit 500 determines whether the counted value of a memory cell row associated with the precharge command reaches a threshold (i.e., the first threshold value NTH1) (operation S120).

When the counted value reaches the threshold (YES in operation S120), the row hammer management circuit 500 puts a row address of the memory cell row associated with the precharge command in the hammer address queue 600 (operation S130).

When the counted value does not reach the threshold (NO in operation S120) or after the row hammer management circuit 500 puts a row address of the memory cell row associated with the precharge command in the hammer address queue 600, the row hammer management circuit 500 determines whether to activate the alert signal ALRT (operation S140).

When the alert signal ALRT is not activated (NO in operation S140), the row hammer management circuit 500 increases the count data CNTD by one (operation S170). When the alert signal ALRT is activated (YES in operation S140), the row hammer management circuit 500 determines whether a condition of disabling randomization is satisfied (operation S150).

The condition of disabling randomization may include disabling the timer 545, activating the reset signal RST and deactivating the alert signal ALRT and when one of the disabling the timer 545, activating the reset signal RST and deactivating the alert signal ALRT is satisfied, the row hammer management circuit 500 determines that the condition of disabling randomization is satisfied.

When the condition of disabling randomization is satisfied (YES in operation S150), the row hammer management circuit 500 increases the count data CNTD by one (operation S170).

When the condition of disabling randomization is not satisfied (NO in operation S150), the row hammer management circuit 500 determines whether the random enable signal is activated (operation S160). When the random enable signal is not activated (NO in S160), the row hammer management circuit 500 increases the count data CNTD by one (operation S170).

When the random enable signal is activated (YES in S160), the row hammer management circuit 500 adds the random value RV to count data CNTD increased by one (operation S180) and thus, the row hammer management circuit 500 changes the count data CNTD randomly.

Figure 29:
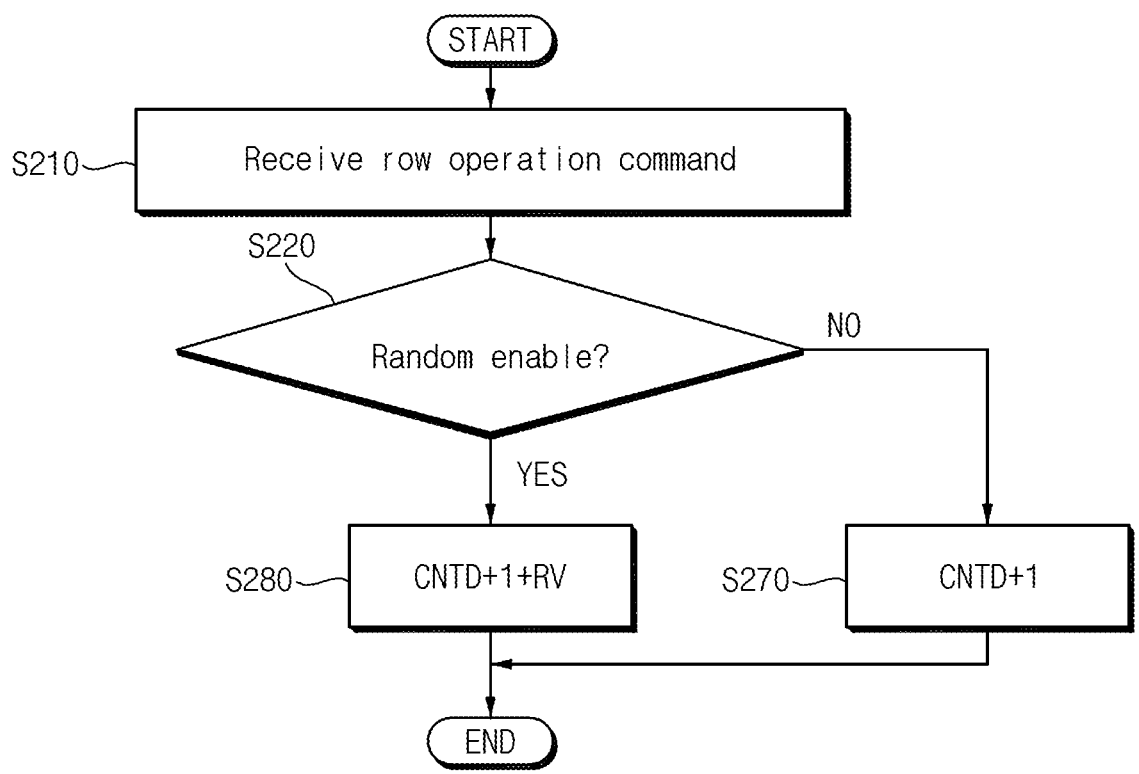
FIG. 29 illustrates operation of the row hammer management circuits of FIGS. 8 through 10 according to example embodiments.

FIG. 29 illustrates operation of the row hammer management circuits of FIGS. 8 through 10 according to example embodiments.

Referring to FIGS. 1 through 10 and 29, the semiconductor memory device 200 receives a row operation command from the memory controller (operation S210). The row operation command corresponds to a precharge command and may be applied to the semiconductor memory device 200 after the active command.

The row hammer management circuit 500 determines whether the random enable signal is activated (operation S220). When the random enable signal is not activated (NO in S220), the row hammer management circuit 500 increases the count data CNTD by one (operation S270).

When the random enable signal is activated (YES in S220), the row hammer management circuit 500 adds the random value RV to count data CNTD increased by one (operation S280) and thus, the row hammer management circuit 500 changes the count data CNTD randomly.

Figure 30:
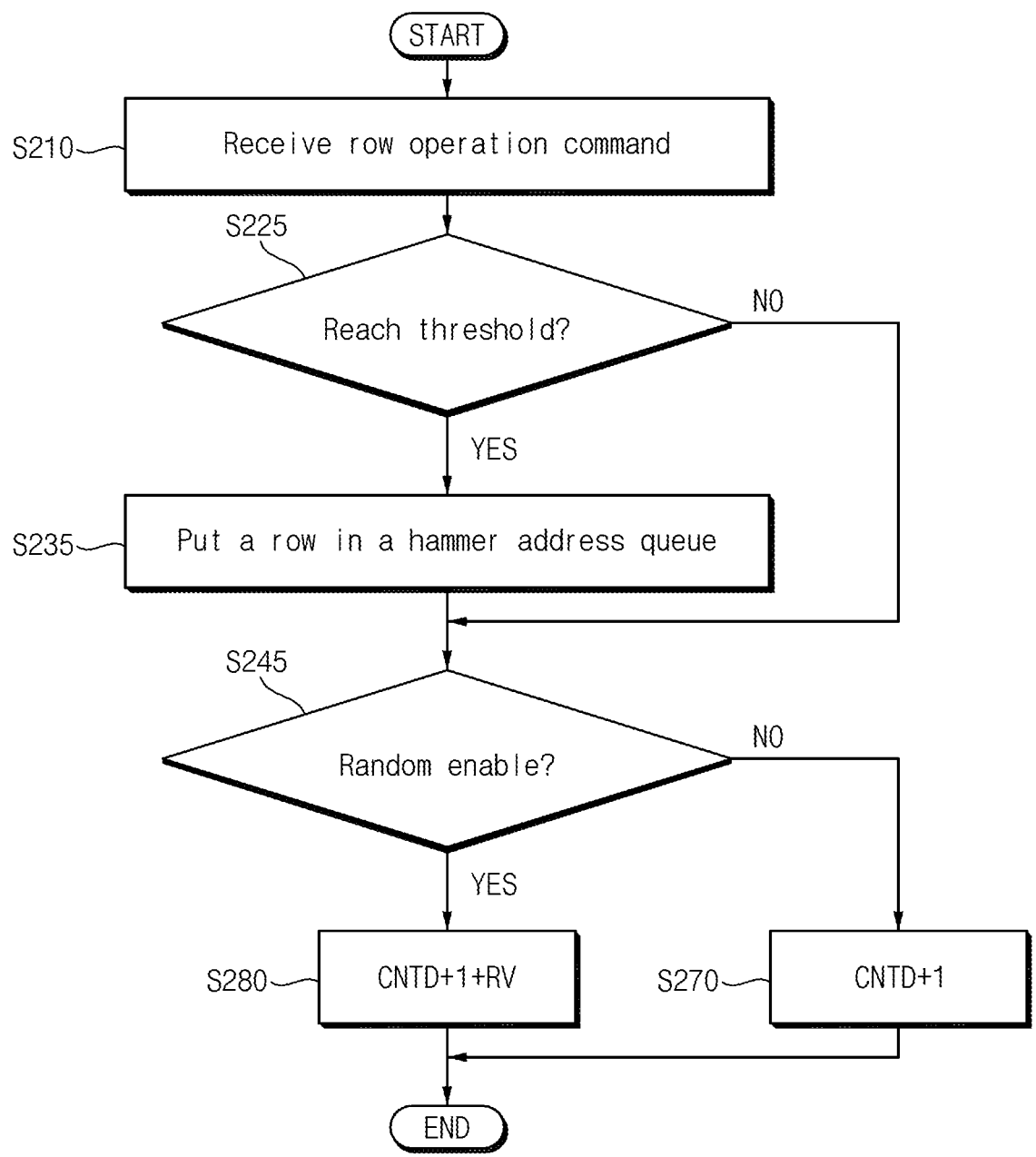
FIG. 30 illustrates operation of the row hammer management circuits of FIGS. 8 through 10 according to example embodiments.

FIG. 30 illustrates operation of the row hammer management circuits of FIGS. 8 through 10 according to example embodiments.

Referring to FIGS. 1 through 10 and 30, the semiconductor memory device 200 receives a row operation command from the memory controller (operation S210). The row operation command corresponds to a precharge command and may be applied to the semiconductor memory device 200 after the active command.

The row hammer management circuit 500 determines whether the counted value of a memory cell row associated with the precharge command reaches a threshold (i.e., the first threshold value NTH1) (operation S225).

When the counted value reaches the threshold (YES in operation S225), the row hammer management circuit 500 puts a row address of the memory cell row associated with the precharge command in the hammer address queue 600 (operation S235).

When the counted value does not reach the threshold (NO in operation S225) or after the row hammer management circuit 500 puts a row address of the memory cell row associated with the precharge command in the hammer address queue 600, the row hammer management circuit 500 determines whether the random enable signal is activated (operation S245). When the random enable signal is not activated (NO in S245), the row hammer management circuit 500 increases the count data CNTD by one (operation S270).

When the random enable signal is activated (YES in S245), the row hammer management circuit 500 adds the random value RV to count data CNTD increased by one (operation S280) and thus, the row hammer management circuit 500 changes the count data CNTD randomly.

Figure 31:
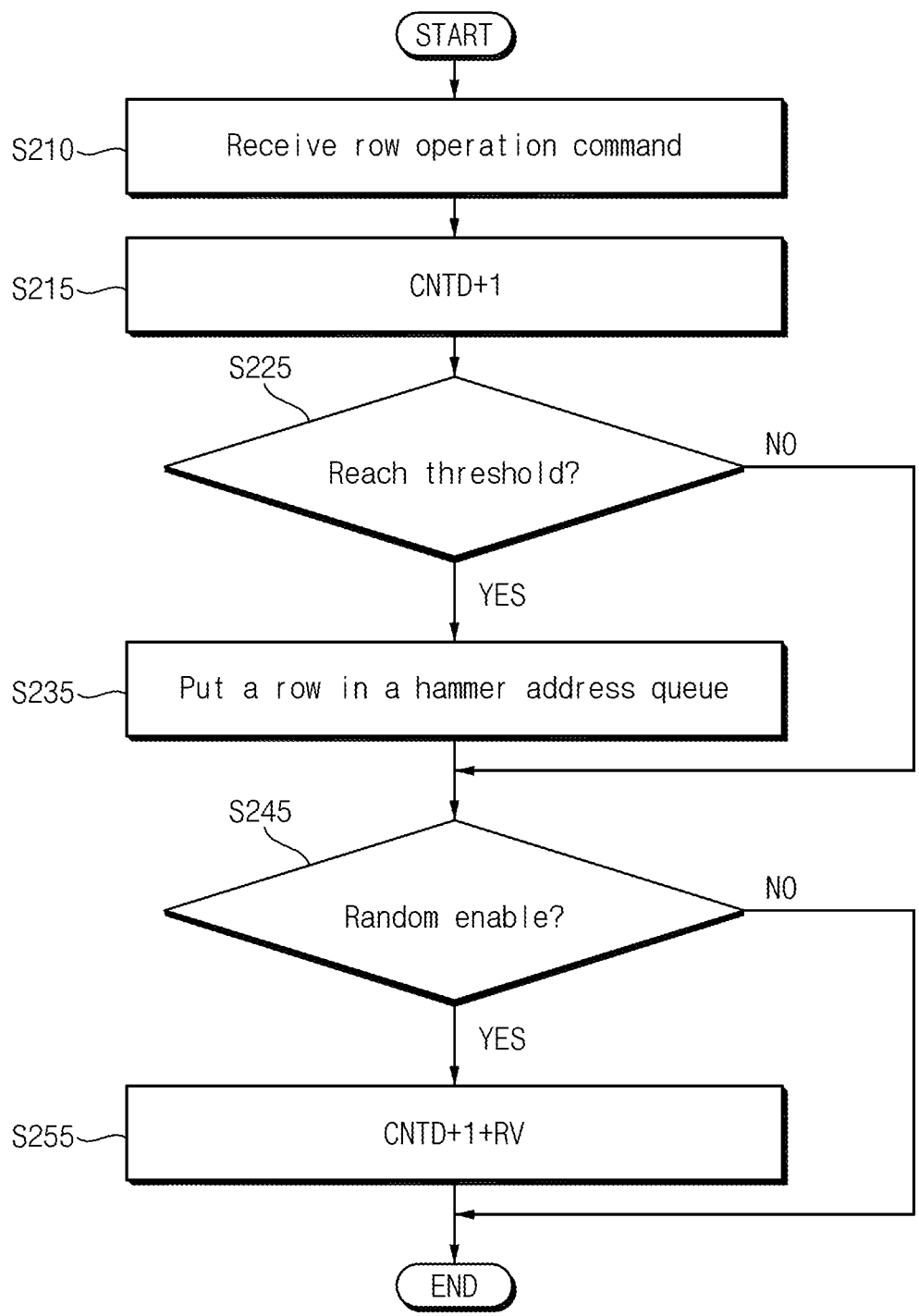
FIG. 31 illustrates operation of the row hammer management circuits of FIGS. 8 through 10 according to example embodiments.

FIG. 31 illustrates operation of the row hammer management circuits of FIGS. 8 through 10 according to example embodiments.

Referring to FIGS. 1 through 10 and 31, the semiconductor memory device 200 receives a row operation command from the memory controller (operation S210). The row operation command corresponds to a precharge command and may be applied to the semiconductor memory device 200 after the active command.

The row hammer management circuit 500 increases the count data CNTD by one (operation S215).

The row hammer management circuit 500 determines whether the counted value of a memory cell row associated with the precharge command reaches a threshold (i.e., the first threshold value NTH1) (operation S225).

When the counted value reaches the threshold (YES in operation S225), the row hammer management circuit 500 puts a row address of the memory cell row associated with the precharge command in the hammer address queue 600 (operation S235).

The row hammer management circuit 500 determines whether the random enable signal is activated (operation S245). When the random enable signal is not activated (NO in S245), the operation is completed.

When the random enable signal is activated (YES in S245), the row hammer management circuit 500 adds the random value RV to count data CNTD increased by one (operation S255) and thus, the row hammer management circuit 500 changes the count data CNTD randomly.

Figure 32:
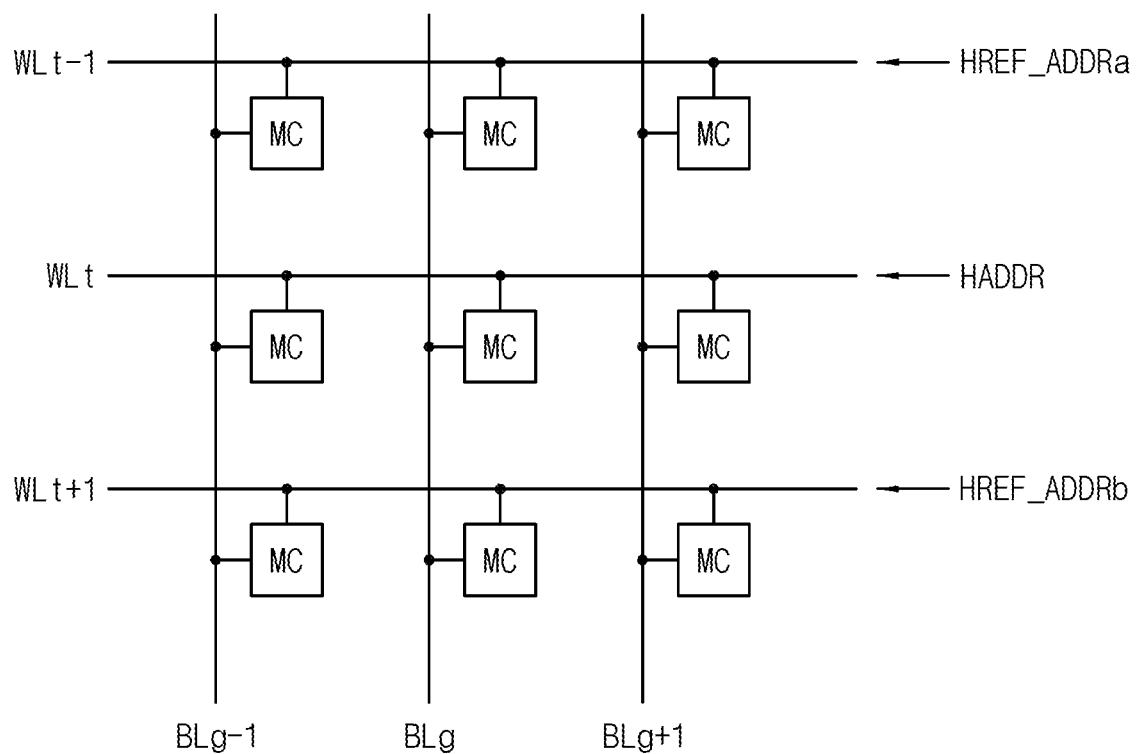
FIG. 32 is a diagram illustrating a portion of a memory cell array for describing generation of hammer refresh addresses.
Figure 32:
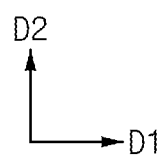

FIG. 32 is a diagram illustrating a portion of a memory cell array for describing generation of hammer refresh addresses.

FIG. 32 illustrates three word-lines WLt−1, WLt and WLt+1, three bit-lines BLg−1, BLg and BLg+1 and memory cells MC coupled to the word-lines WLt−1, WLt and WLt+1 and the bit-lines BLg−1, BLg and BLg+1 in the memory cell array. The three word-lines WLt−1, WLt and WLt+1 are extended in the first direction D1 and arranged sequentially along the second direction D2. The three bit-lines BLg−1, BLg and BLg+1 are extended in the second direction D2 and arranged sequentially along the first direction D1. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 5 may provide the hammer refresh address HREF_ADDR representing the addresses HREF_ADDRa and HREF_ADDRb of the rows (e.g., the word-lines WLt−1 and WLt+1) that are physically adjacent to the row of the hammer address HADDR (e.g., the hammer word-line WLt), and a refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 33:
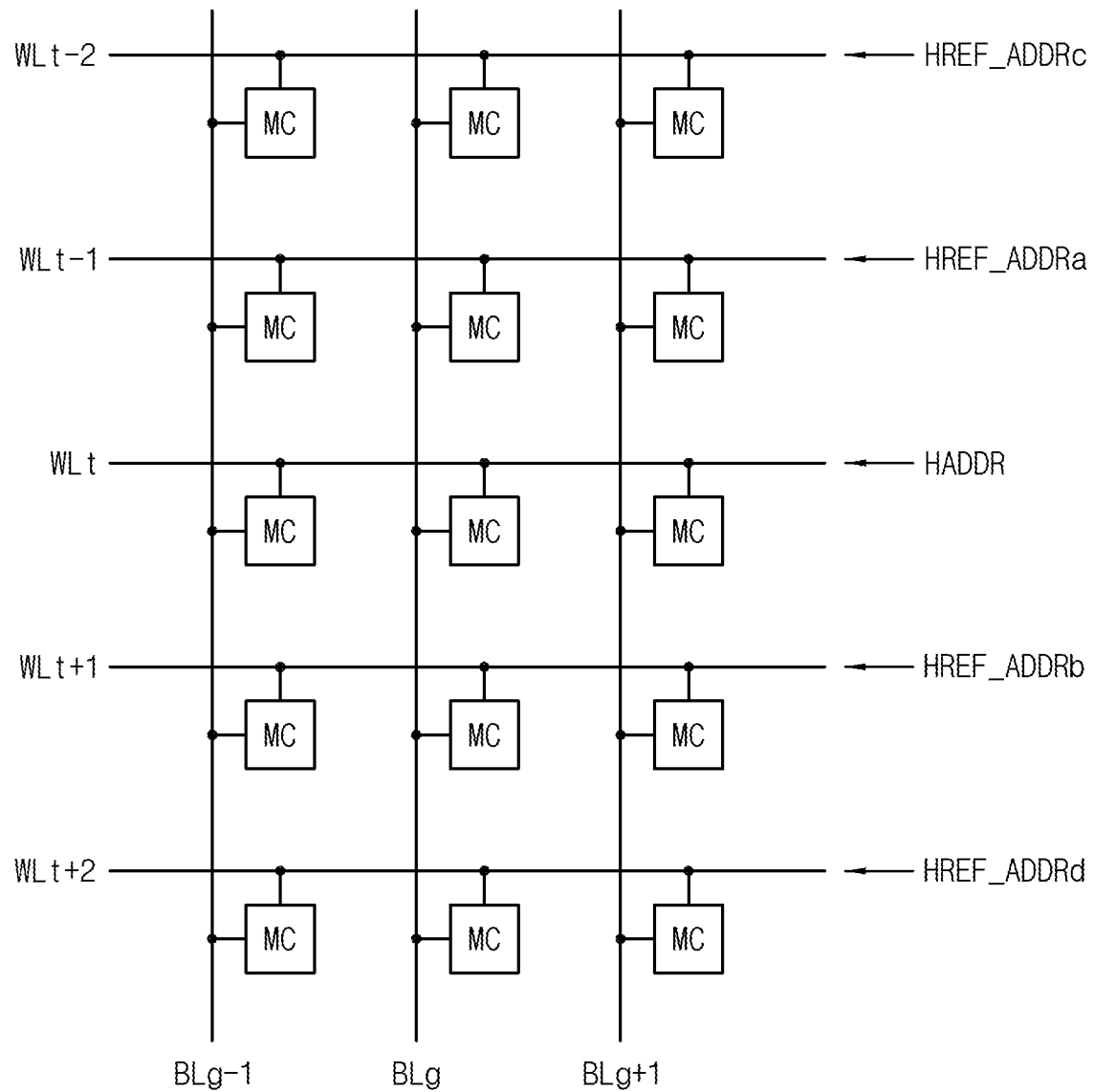
FIG. 33 is a diagram illustrating a portion of a memory cell array for describing generation of hammer refresh addresses in response to the second type of hammer address.

FIG. 33 is a diagram illustrating a portion of a memory cell array for describing generation of hammer refresh addresses in response to the second type of hammer address.

FIG. 33 illustrates five word-lines WLt−2, WLt−1, WLt, WLt+1 and WLt+2, three bit-lines BLg−1, BLg and BLg+1 and memory cells MC coupled to the word-lines WLt−2, WLt−1, WLt, WLt+1 and WLt+2 and the bit-lines BLg−1, BLg and BLg+1 in the memory cell array. The five word-lines WLt−2, WLt−1, WLt, WLt+1 and WLt+2 are extended in the first direction D1 and arranged sequentially along the second direction D2.

The hammer refresh address generator 440 in FIG. 5 may provide the hammer refresh address HREF_ADDR representing addresses HREF_ADDRa, HREF_ADDRb, HREF_ADDRc and HREF_ADDRd of the rows (e.g., the word-lines WLt−1, WLt+1, WLt−2 and WLt+2) that are physically adjacent to the row of the hammer address HADDR (e.g., the middle word-line WLt), and a refresh operation for the adjacent word-lines WLt−1, WLt+1, WLt−2 and WLt+2 may be performed additionally based on (e.g., in response to) the hammer refresh address HREF_ADDR to reduce or possibly prevent the loss of data stored in the memory cells MC.

Figure 34A:
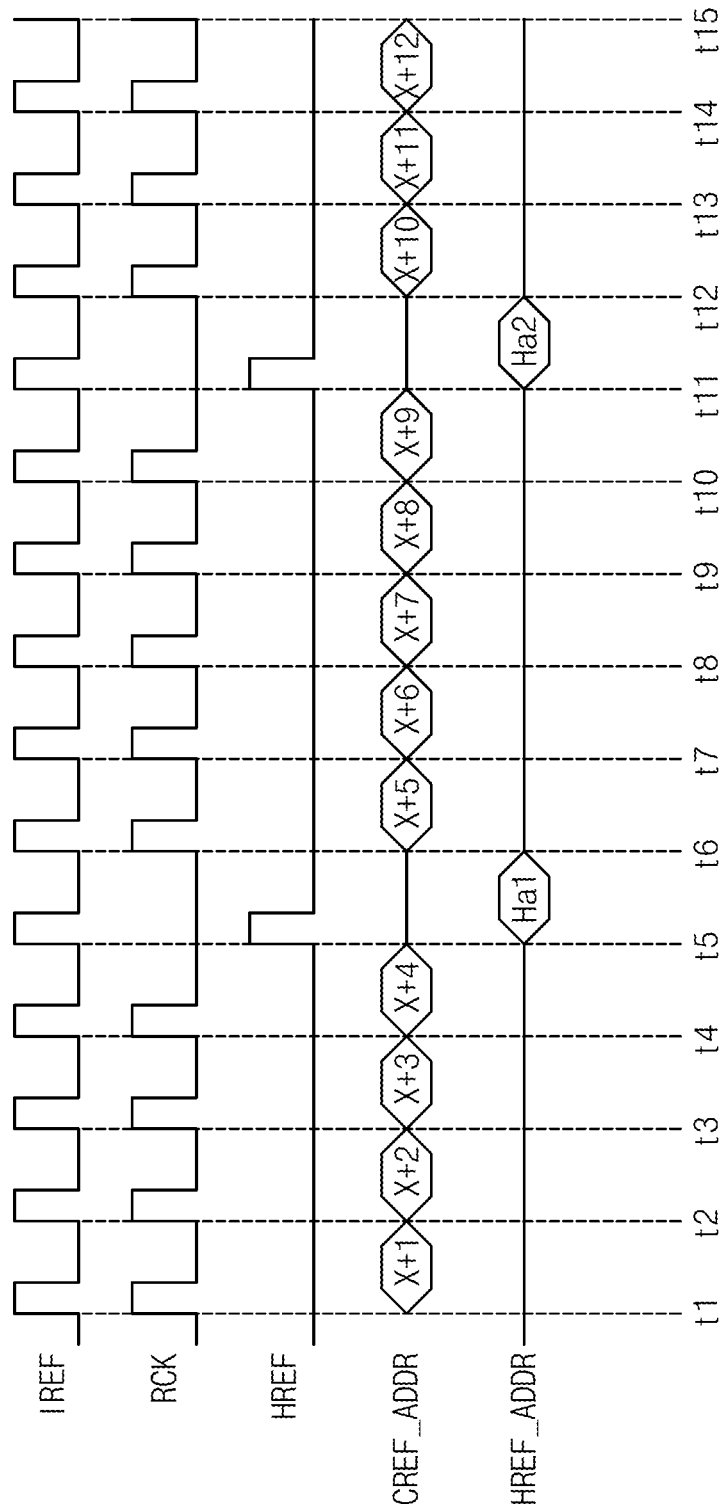
FIGS. 34A, 34B and 35 are timing diagrams illustrating example operations of a refresh control circuit of FIG. 5 according to example embodiments.
Figure 34B:
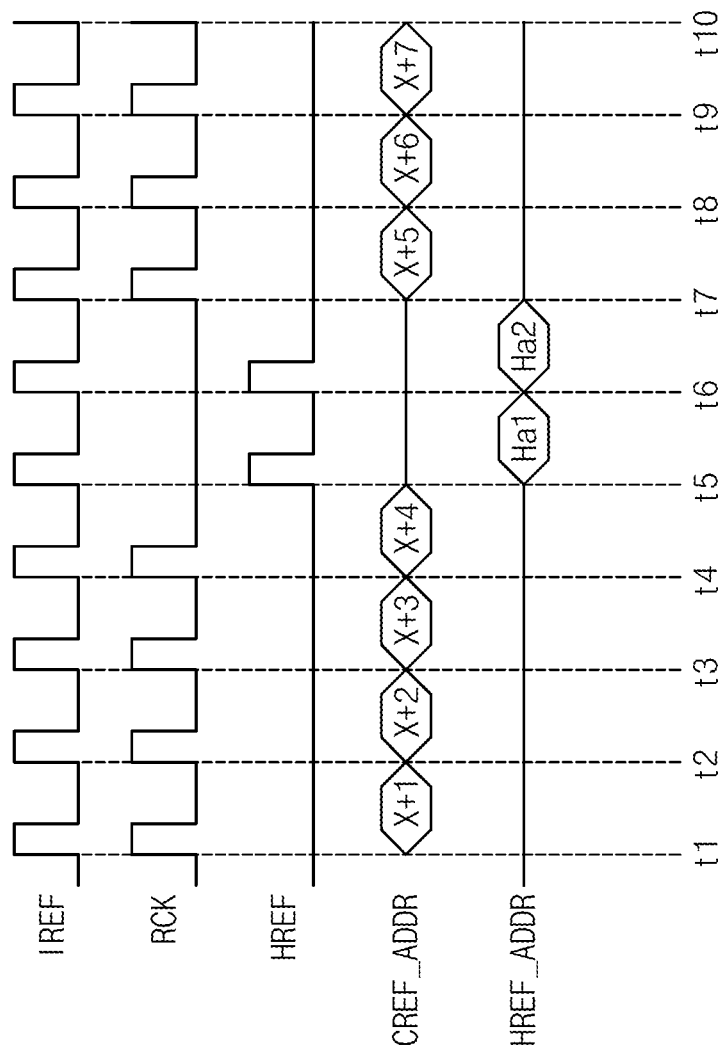
Figure 35:
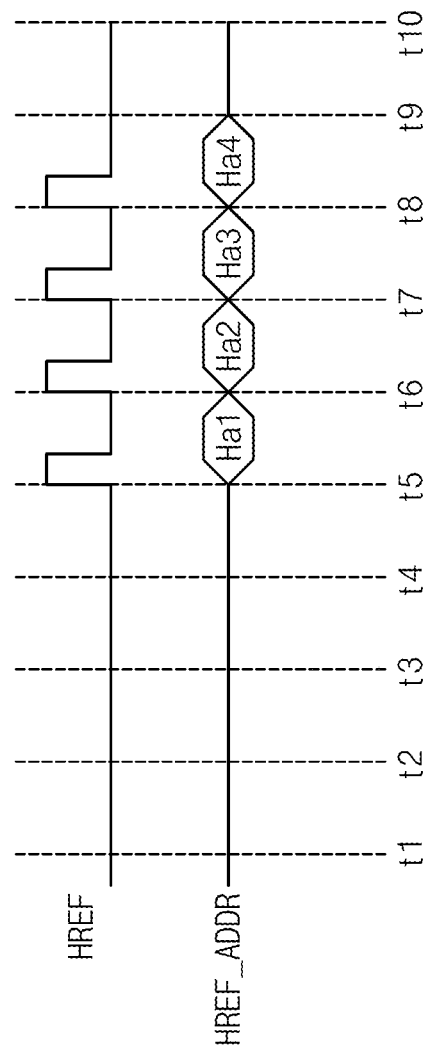

FIGS. 34A, 34B and 35 are timing diagrams illustrating example operations of a refresh control circuit of FIG. 5 according to example embodiments.

FIGS. 34A and 34B illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape at activation time points t1~t15 or at activation time points t1~t10. The intervals between the activation time points t1~t15 or the activation time points t1~t10 of the refresh control signal IREF may be regular or irregular.

Referring to FIGS. 5 and 34A, the refresh control logic 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+12 in synchronization with the activation time points t1~t4, t6~t10 and t12~t14 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 5 and 34B, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t9 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Referring to FIGS. 5 and 35, the hammer refresh address generator 440 may generate the hammer refresh address HREF_ADDR representing the address Ha1, Ha2, Ha3 and Ha4 of the rows that are physically adjacent to the row of the hammer address in synchronization with the activation time points t5, t6, t7, t8 of the hammer refresh signal HREF.

Figure 36:
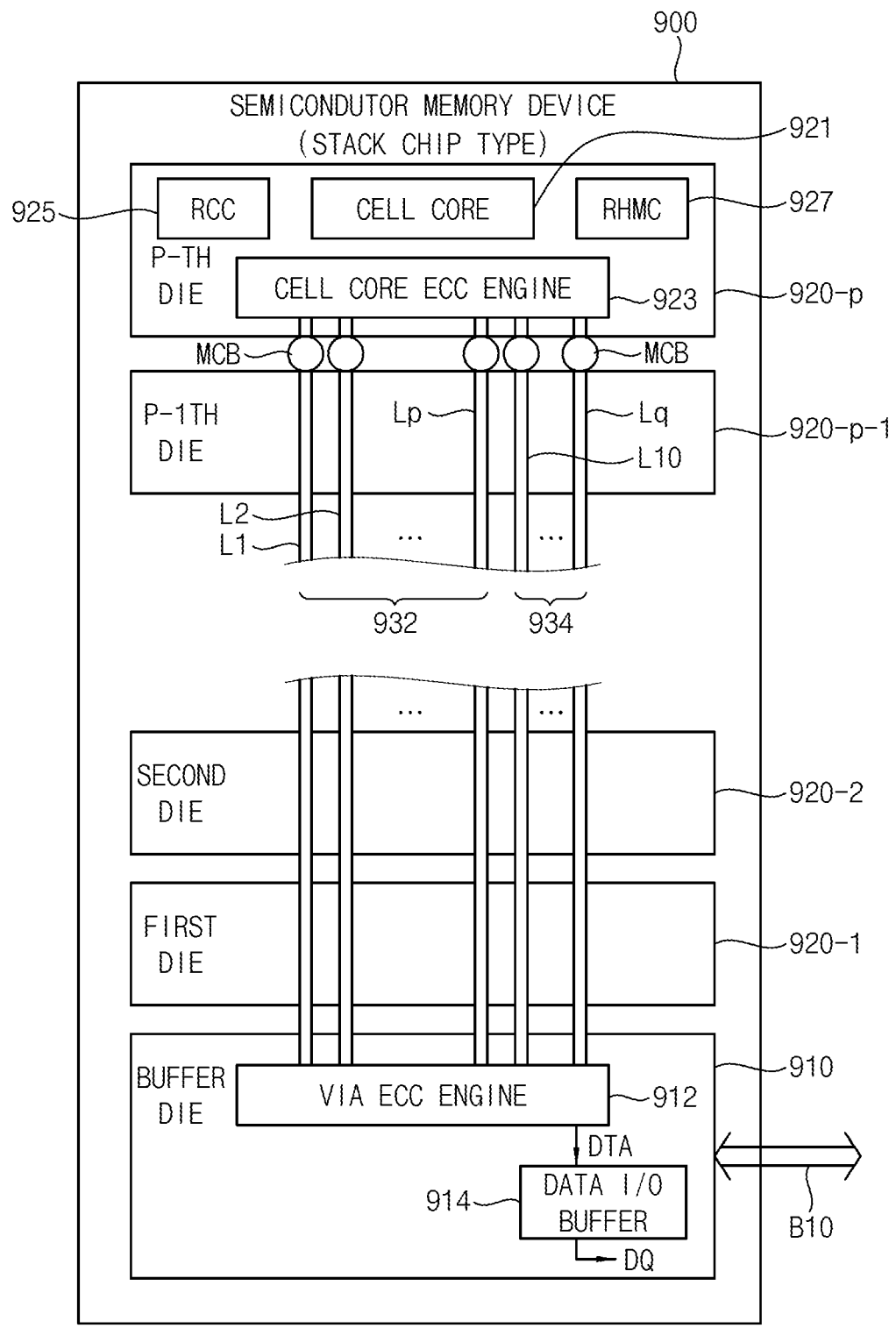
FIG. 36 is a block diagram illustrating a semiconductor memory device according to example embodiments.

FIG. 36 is a block diagram illustrating a semiconductor memory device according to example embodiments.

Referring to FIG. 36, a semiconductor memory device 900 may include at least one buffer die 910 and a plurality of memory dies 920-1 to 920-p (p is a natural number equal to or greater than three) providing a soft error analyzing and correcting function in a stacked chip structure.

The plurality of memory dies 920-1 to 920-p are stacked on the buffer die 810 and conveys data through a plurality of through silicon via (TSV) lines.

Each of the plurality of memory dies 920-1 to 920-p may include a cell core 921 to store data, a cell core ECC engine 923 which generates transmission parity bits (i.e., transmission parity data) based on transmission data to be sent to the at least one buffer die 910, a refresh control circuit (RCC) 925 and a row hammer management circuit (RHMC) 927. The cell core 921 may include a plurality of memory cells having DRAM cell structure.

The refresh control circuit 925 may employ the refresh control circuit 400 of FIG. and the row hammer management circuit 927 may employ the row hammer management circuit 500 of FIG. 9. The row hammer management circuit 927 may store an active count of each of the plurality of memory cell rows in the count cells in each of the plurality of memory cell rows as a count data, may update the count data based on a precharge command which is applied after the active command, and may change the count data randomly based on a state change of a hammer address queue included in the row hammer management circuit 927. The hammer address queue may transition a logic level of an alert signal provided to a memory controller from a first logic level to a second logic level in response to candidate hammer addresses being stored in all of FIFO registers in the hammer address queue, and may output one of the candidate hammer addresses as a hammer address. The refresh control circuit 925 may receive the hammer address from the row hammer management circuit 927 and may perform a hammer refresh operation on one or more victim memory cell rows physically adjacent to a memory cell row corresponding to the hammer address.

The buffer die 910 may include a via ECC engine 912 which corrects a transmission error using the transmission parity bits when a transmission error is detected from the transmission data received through the TSV lines and generates error-corrected data.

The buffer die 910 may further include a data I/O buffer 916. The data I/O buffer 916 may generate the data signal DQ by sampling the data DTA from the via ECC engine 912 and may output the data signal DQ to an outside.

The semiconductor memory device 900 may be a stack chip type memory device or a stacked memory device which conveys data and control signals through the TSV lines. The TSV lines may be also called 'through electrodes'.

The cell core ECC engine 923 may perform error correction on data which is outputted from the memory die 920-$p$ before the transmission data is sent.

A data TSV line group 932 which is formed at one memory die 920-$p$ may include TSV lines L1, L2, Lp, and a parity TSV line group 934 may include TSV lines L10 to Lq. The TSV lines L1, L2, Lp of the data TSV line group 932 and the parity TSV lines L10 to Lq of the parity TSV line group 934 may be connected to micro bumps MCB which are correspondingly formed among the memory dies 920-1 to 920-$p$.

The semiconductor memory device 900 may have a three-dimensional (3D) chip structure or a 2.5D chip structure to communicate with the host through a data bus B10. The buffer die 910 may be connected with the memory controller through the data bus B10.

According to example embodiments, as illustrated in FIG. 36, the cell core ECC engine 923 may be included in the memory die, the via ECC engine 912 may be included in the buffer die. Accordingly, it may be possible to detect and correct soft data fail. The soft data fail may include a transmission error which is generated due to noise when data is transmitted through TSV lines.

Figure 37:
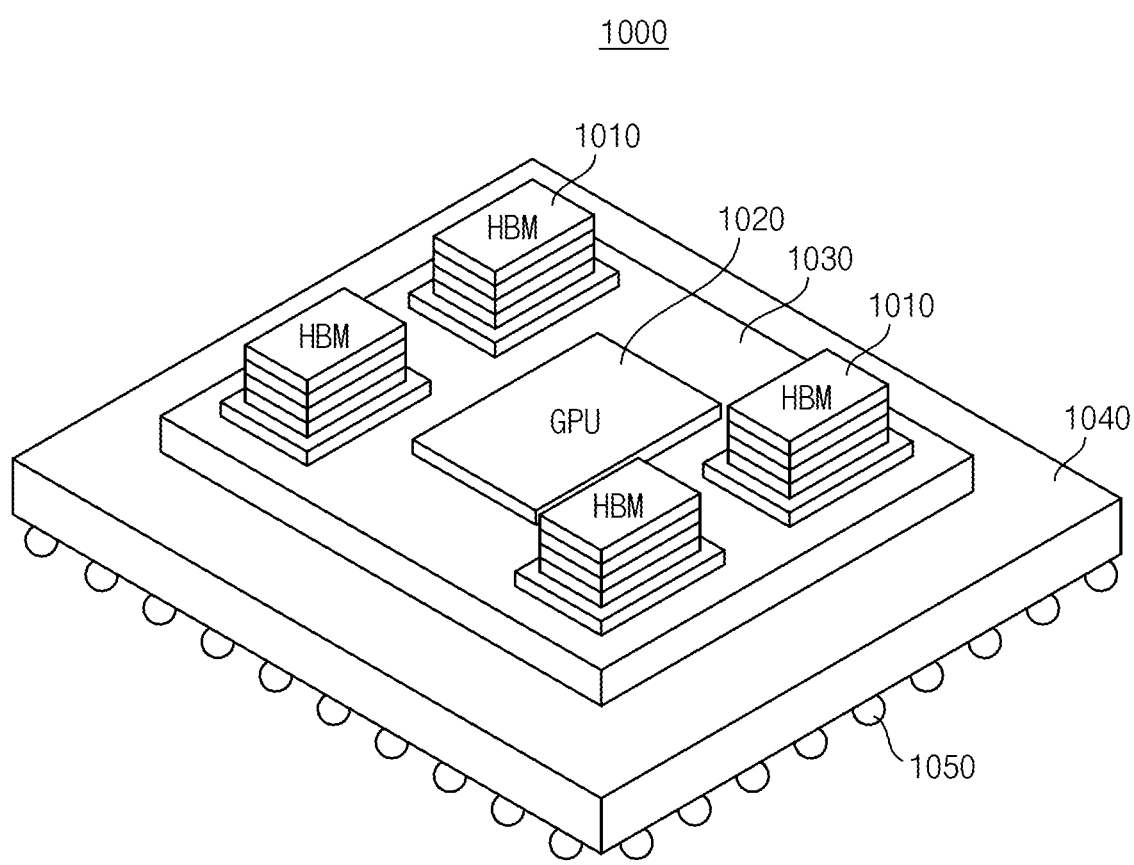
FIG. 37 is a configuration diagram illustrating a semiconductor package including the stacked memory device according to example embodiments.

FIG. 37 is a configuration diagram illustrating a semiconductor package including the stacked memory device according to example embodiments.

Referring to FIG. 37, a semiconductor package 1000 may include one or more stacked memory devices 1010 and a graphic processing unit (GPU) 1020.

The stacked memory devices 1010 and the GPU 1020 may be mounted on an interposer 1030, and the interposer on which the stacked memory device 1010 and the GPU 1020 are mounted may be mounted on a package substrate 1040 mounted on solder balls 1050. The GPU 1020 may correspond to a semiconductor device which may perform a memory control function, and for example, the GPU 1020 may be implemented as an application processor (AP). The GPU 1020 may include a memory controller having a scheduler.

The stacked memory device 1010 may be implemented in various forms, and the stacked memory device 1010 may be a memory device in a high bandwidth memory (HBM) form in which a plurality of layers are stacked. Accordingly, the stacked memory device 1010 may include a buffer die and a plurality of memory dies and each of the plurality of memory dies include a refresh control circuit and a row hammer management circuit.

The plurality of stacked memory devices 1010 may be mounted on the interposer 1030, and the GPU 1020 may communicate with the plurality of stacked memory devices 1010. For example, each of the stacked memory devices 1010 and the GPU 1020 may include a physical region, and communication may be performed between the stacked memory devices 1010 and the GPU 1020 through the physical regions. Meanwhile, when the stacked memory device 1010 includes a direct access region, a test signal may be provided into the stacked memory device 1010 through conductive means (e.g., solder balls 1050) mounted under package substrate 1040 and the direct access region.

Figure 38:
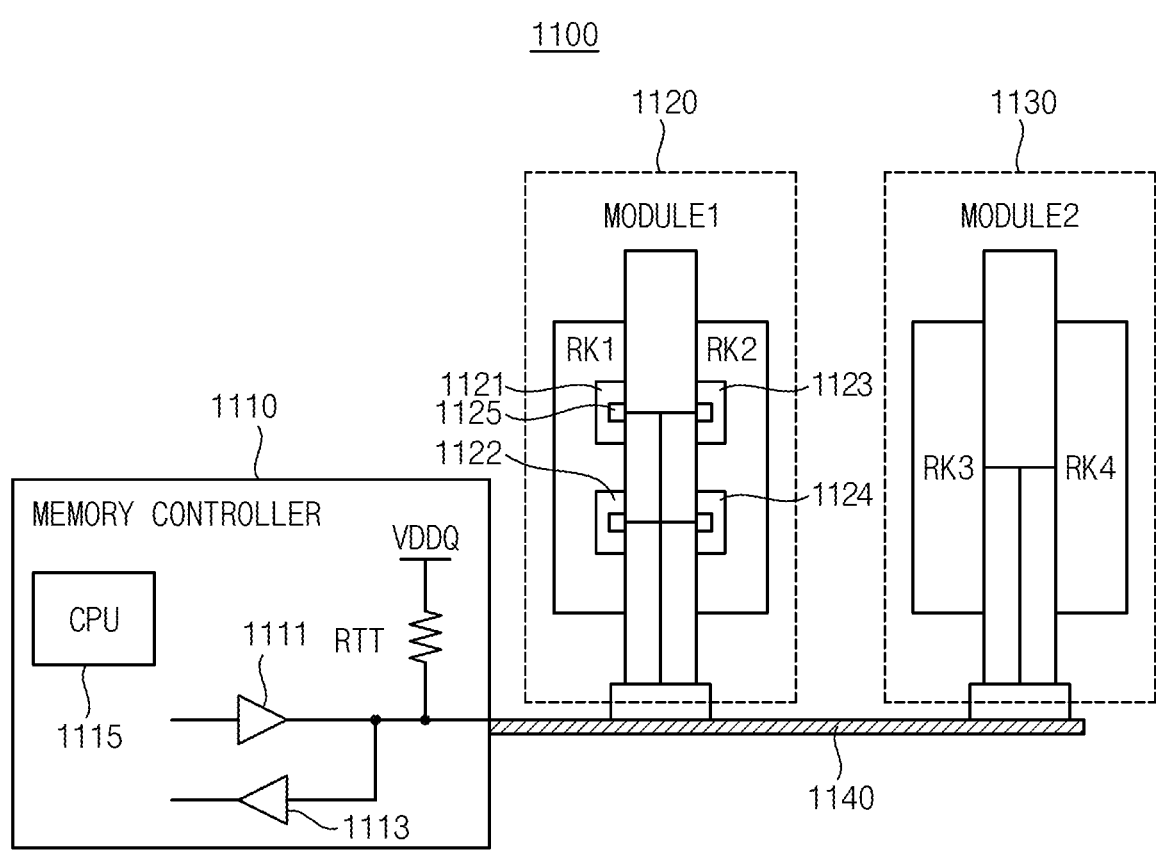
FIG. 38 is a block diagram illustrating a memory system having quad-rank memory modules according to example embodiments.

FIG. 38 is a block diagram illustrating a memory system having quad-rank memory modules according to example embodiments.

Referring to FIG. 38, a memory system 1100 may include a memory controller 1110 and/or memory modules 1120 and 1130. While two memory modules are depicted in FIG. 38, more or fewer memory modules may be included in the memory system 1100, according to some example embodiments.

The memory controller 1110 may control a memory module 1120 and/or 1130 so as to perform a command supplied from a processor and/or host. The memory controller 1010 may be implemented using processing circuitry (e.g., a processor) and/or may be implemented with a host, an application processor or a system-on-a-chip (SoC). For signal integrity, a source termination may be implemented with a resistor RTT on a bus 1140 of the memory controller 1110. The resistor RTT may be coupled to a power supply voltage VDDQ. The memory controller 1110 may include a transmitter 1111, which may transmit a signal to at least one of the memory modules 1120 and/or 1130, and a receiver 1113 that may receive a signal from at least one of the memory modules 1120 and/or 1130. The memory controller 1110 may include a CPU 1115.

The memory modules 1120 and 1130 may be referred to as a first memory module 1120 and a second memory module 1130. The first memory module 1120 and the second memory module 1130 may be coupled to the memory controller 1110 through the bus 1140. Each of the first memory module 1120 and the second memory module 1130 may include a plurality of semiconductor memory devices and/or a registered clock driver. The first memory module 1120 may include memory ranks RK1 and RK2, and the second memory module 1130 may include memory ranks RK3 and RK4.

The memory rank RK1 may include semiconductor memory devices 1121 and 1122 and the memory rank RK2 may include semiconductor memory devices 1123 and 1124. Although not illustrated, each of the memory ranks RK3 and RK4 may include semiconductor memory devices. Each of the semiconductor memory devices 1121, 1122, 1123 and 1124 may employ the semiconductor memory device 200 of FIG. 3.

Each of the semiconductor memory devices 1121, 1122, 1123 and 1124 may be connected to the memory controller 1110 through an alert pin 1125 and the bus 1140. Each semiconductor memory devices 1121, 1122, 1123 and 1124 may notify the memory controller 1110 of an error state by changing a logic level of an alert signal through the alert pin 1125.

The alert pin 1125 of each of the semiconductor memory devices 1121, 1122, 1123 and 1124 may be commonly connected to the bus 1140. When at least one of the semiconductor memory devices 1121, 1122, 1123 and 1124 changes a logic level of the alert signal, a voltage across the resistor RTT is changed and thus, the CPU 1115 may identify that a situation of a hammer address queue being full occurs in at least one of the semiconductor memory devices 1121, 1122, 1123 and 1124.

Therefore, in the semiconductor memory device according to example embodiments while the row hammer management circuit counts each of active numbers associated with the plurality of memory cell rows to store the counted values in the count cells of each of the plurality of memory cell rows as count data, the semiconductor memory device randomizes count data in the count cells of each of the plurality of memory cell rows in response to an event of the hammer address queue, or periodically and thus prevent overflow of the hammer address queue and performance of the memory system from being degraded due to intentional accesses of a hacker.

Aspects of the present disclosure may be applied to systems using semiconductor memory devices that employ volatile memory cells. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
a memory cell array including a plurality of memory cell rows, wherein each of the plurality of memory cell rows comprises a respective plurality of memory cells; and
a row hammer management circuit configured to perform operations comprising:
determining count data by counting a number of times each of the plurality of memory cell rows are accessed in response to an active command from an external memory controller;
storing the count data as counted values in count cells associated with respective ones of the plurality of memory cell rows; and
in response to a first command applied after the active command was applied, performing an internal read-update-write operation, wherein the internal read-update-write operation comprises reading the count data from the count cells of a target memory cell row from among the plurality of memory cell rows, updating the count data that was read to obtain updated count data, and writing the updated count data in a respective ones of the count cells of the target memory cell row,
wherein the row hammer management circuit comprises a hammer address queue,
wherein the row hammer management circuit is configured to perform operations comprising:
storing one or more candidate hammer addresses of the plurality of memory cell rows which are intensively accessed, based on a comparison of respective ones of the counted values associated with a respective one of the plurality of memory cell rows with a first reference number of times of access; and
providing one of the candidate hammer addresses stored in the hammer address queue as a hammer address, and
wherein the row hammer management circuit is configured to change the updated count data randomly, based on an event signal indicating a state change of the hammer address queue.

2. The semiconductor memory device of claim 1, wherein the event signal corresponds to an alert signal indicating that a number of the candidate hammer addresses stored in the hammer address queue is equal to a maximum number of candidate hammer addresses.

3. The semiconductor memory device of claim 2, wherein the row hammer management circuit is configured to change the updated count data randomly by adding a random value to the updated count data or by subtracting the random value from the updated count data when an alert signal is activated.

4. The semiconductor memory device of claim 2, wherein the row hammer management circuit is configured to change the updated count data randomly by adding a random value to the updated count data or by subtracting the random value from the updated count data during a first time interval after an alert signal is activated.

5. The semiconductor memory device of claim 1, wherein the event signal corresponds to a store signal indicating that a memory cell row having a corresponding one of the counted values equal to or greater than the first reference number is stored in the hammer address queue.

6. The semiconductor memory device of claim 5, wherein the row hammer management circuit is configured to change the updated count data randomly by adding a random value to the updated count data or by subtracting the random value from the updated count data when the store signal is activated.

7. The semiconductor memory device of claim 5, wherein the row hammer management circuit is configured to change the updated count data randomly by adding a random value to the updated count data or by subtracting the random value from the updated count data during a first time interval after the store signal has been activated.

8. The semiconductor memory device of claim 1, wherein the row hammer management circuit is configured to activate an alert signal when a number of the candidate hammer addresses stored in the hammer address queue is equal to a maximum number of candidate hammer addresses, and
wherein the row hammer management circuit further comprises:
an adder configured to update the count data and generate the updated count data;
a comparator configured to compare the count data with the first reference number of times of access to generate a store signal;
a random value generator configured to generate a random value in response to the alert signal being active; and
a complementary value generator configured to generate a complementary value of the random value by inverting the random value, and
wherein the adder is configured to change the updated count data randomly by adding one of the random value or the complementary value to the updated count data.

9. The semiconductor memory device of claim 8, wherein the random value generator includes a counter that is enabled during a first time interval in response to the alert signal being active, and
wherein the random value generator is configured to generate the random value during the first time interval.

10. The semiconductor memory device of claim 1, wherein the row hammer management circuit further comprises:
- an adder configured to update the count data generate the updated count data;
- a comparator configured to compare the count data with the first reference number of times of access to generate a store signal;
- a random value generator configured to generate a random value in response to the store signal being active; and
- a complementary value configured to generate a complementary value of the random value by inverting the random value, and
- wherein the adder is configured to change the updated count data randomly by adding one of the random value or the complementary value to the updated count data.

11. The semiconductor memory device of claim 10, wherein the random value generator includes a counter that is enabled during a first time interval in response to an alert signal being active, and
- wherein the random value generator is configured to generate the random value during the first time interval.

12. The semiconductor memory device of claim 11,
- wherein the random value generator is further configured to generate the random value in response to one of the store signal or an alert signal from the hammer address queue,
- wherein the adder is further configured to change the updated count data randomly by adding the random value to the updated count data or by subtracting the random value from the updated count data, and
- wherein the hammer address queue is further configured to store a target access address designating the target memory cell row in response to the store signal indicating that the count data is equal to or greater than the first reference number of times of access.

13. The semiconductor memory device of claim 12, wherein the hammer address queue comprises:
- a plurality of first-in first-out (FIFO) registers configured to store the candidate hammer addresses, wherein a number of the plurality of FIFO registers corresponds to a maximum number of candidate hammer addresses in the hammer address queue; and
- a monitor logic connected to the plurality of FIFO registers and configured to perform operations comprising:
  - managing the plurality of FIFO registers;
  - monitoring which ones of the plurality of FIFO registers store respective one of the candidate hammer addresses;
  - in response to a number of the candidate hammer addresses stored in the plurality of FIFO registers being equal to the maximum number of candidate hammer addresses, outputting a candidate hammer address that was input first into the plurality of FIFO registers from among the candidate hammer addresses as the hammer address; and
  - transitioning a logic level of an alert signal from a first logic level to a second logic level different from the first logic level in response to outputting the hammer address.

14. The semiconductor memory device of claim 1, further comprising:
- a refresh control circuit configured to receive the hammer address and to perform a hammer refresh operation on one or more victim memory cell rows which are physically adjacent to a memory cell row corresponding to the hammer address, and wherein the refresh control circuit comprises:
- a refresh control logic configured to generate a hammer refresh signal in response to a refresh management signal which is based on a refresh management command provided from the external memory controller in response to a transition of an alert signal indicating that a number of the candidate hammer addresses stored in the hammer address queue is equal to a maximum number of candidate hammer addresses;
- a refresh clock generator configured to generate a refresh clock signal in response to a refresh signal;
- a refresh counter configured to generate a count refresh address associated with a normal refresh operation on the plurality of memory cell rows;
- a hammer address storage configured to store the hammer address and configured to output the hammer address in response to the hammer refresh signal; and
- a mapper configured to generate one or more hammer refresh addresses designating addresses of the one or more victim memory cell rows based on the hammer address that is output from the hammer address storage.

15. The semiconductor memory device of claim 1, further comprising:
- an error correction code (ECC) engine configured to perform operations comprising:
  - performing a first ECC encoding operation on data to be stored in normal cells in each of the plurality of memory cell rows to generate a parity data; and
  - performing a second ECC encoding operation on the count data to generate a count parity data; and
- a control logic circuit configured to control the row hammer management circuit and the ECC engine.

16. The semiconductor memory device of claim 15, wherein the memory cell array comprises:
- a normal cell region that includes the normal cells to store the data and the count cells to store the count data; and
- a parity cell region to store the parity data and the count parity data,
- wherein the normal cell region includes a plurality of sub array blocks arranged in a first direction and a second direction crossing the first direction, each of the plurality of sub array blocks including volatile memory cells, and
- wherein a portion of the plurality of sub array blocks include the count cells.

17. The semiconductor memory device of claim 1, wherein the first command corresponds to a precharge command on the target memory cell row.

18. A semiconductor memory device comprising:
- a memory cell array including a plurality of memory cell rows, each including a respective plurality of memory cells;
- a row hammer management circuit configured to perform operations comprising:
  - determining count data by counting a number of times each of the plurality of memory cell rows are accessed in response to an active command from an external memory controller;
  - storing the count data as counted values in count cells associated with respective ones of the plurality of memory cell rows; and
  - in response to a first command applied after the active command was applied, performing an internal read-update-write operation, wherein the internal read-update-write operation comprises reading the count data from the count cells of a target memory cell row from among the plurality of memory cell rows, updating the count data that was read to obtain updated count data, and writing the updated count data in a respective ones of the count cells of the target memory cell row, wherein the row hammer management circuit comprises a hammer address queue, wherein the row hammer management circuit is configured to perform operations comprising:

storing one or more candidate hammer addresses of the plurality of memory cell rows which are intensively accessed up to a maximum number of candidate hammer addresses in the hammer address queue, based on a comparison of respective ones of the counted values associated with a respective one of the plurality of memory cell rows with a first reference number of times of access; and providing one of the candidate hammer addresses stored in the hammer address queue as a hammer address, wherein the row hammer management circuit is configured to change the updated count data randomly during a first time interval, based on a random enable signal; and a refresh control circuit configured to receive the hammer address and to perform a hammer refresh operation on one or more victim memory cell rows which are physically adjacent to a memory cell row corresponding to the hammer address.

19. The semiconductor memory device of claim 18, wherein the first command corresponds to a precharge command on the target memory cell row, and wherein the row hammer management circuit further comprises:

an adder configured to update the count data and generate the updated count data;

a comparator configured to compare the count data with the first reference number of times of access to generate a store signal;

a random value generator configured to generate a random value in response to the random enable signal; and a random seed generator configured to generate the random enable signal based on a periodic signal generated in the semiconductor memory device, and wherein the adder is configured to change the updated count data randomly by adding the random value to the updated count data or by subtracting the random value from the updated count data.

20. A memory system comprising:

a semiconductor memory device; and a memory controller configured to control the semiconductor memory device, wherein the semiconductor memory device comprises:

a memory cell array including a plurality of memory cell rows, each including a plurality of memory cells;

a row hammer management circuit configured to perform operations comprising:

determining count data by counting a number of times each of the plurality of memory cell rows are accessed in response to an active command from an external memory controller to store counted values in count cells of each of the plurality of memory cell rows as count data; and in response to a first command applied after the active command was applied, performing an internal read-update-write operation, wherein the internal read-update-write operation comprises reading the count data from the count cells of a target memory cell row from among the plurality of memory cell rows, updating the count data that was read to obtain updated count data, and writing the updated count data in a respective ones of the count cells of the target memory cell row, wherein the row hammer management circuit comprises a hammer address queue, wherein the row hammer management circuit is configured to perform operations comprising:

storing one or more candidate hammer addresses of the plurality of memory cell rows which are intensively accessed up to a maximum number of candidate hammer addresses in the hammer address queue, based on a comparison of respective ones of the counted values associated with a respective one of the plurality of memory cell rows with a first reference number of times of access; and providing one of the candidate hammer addresses stored in the hammer address queue as a hammer address, wherein the row hammer management circuit is configured to change the updated count data randomly, based on an event signal indicating a state change of the hammer address queue; and a refresh control circuit configured to receive the hammer address and to perform a hammer refresh operation on one or more victim memory cell rows which are physically adjacent to a memory cell row corresponding to the hammer address.

* * * * *